(12) United States Patent
Schatz

(10) Patent No.: US 7,321,159 B2
(45) Date of Patent: Jan. 22, 2008

(54) METHOD AND APPARATUS FOR SELF-ASSEMBLY OF FUNCTIONAL BLOCKS ON A SUBSTRATE FACILITATED BY ELECTRODE PAIRS

(75) Inventor: Kenneth David Schatz, San Jose, CA (US)

(73) Assignee: Alien Technology Corporation, Morgan Hill, CA (US)

(*) Notice: Subject to any disclaimer, the term of this patent is extended or adjusted under 35 U.S.C. 154(b) by 146 days.

(21) Appl. No.: 10/913,681

(22) Filed: Aug. 5, 2004

(65) Prior Publication Data

US 2005/0009303 A1   Jan. 13, 2005

Related U.S. Application Data

(62) Division of application No. 09/953,639, filed on Sep. 17, 2001, now Pat. No. 6,780,696.

(60) Provisional application No. 60/232,089, filed on Sep. 12, 2000.

(51) Int. Cl.
*H01L 29/06* (2006.01)
(52) U.S. Cl. ...................... 257/622; 257/559
(58) Field of Classification Search ............... 257/786, 257/723, 724, 777, 559, 622
See application file for complete search history.

(56) References Cited

U.S. PATENT DOCUMENTS

| | | | |
|---|---|---|---|
| 3,291,896 A * | 12/1966 | Vincent | .................. 174/120 R |
| 3,439,416 A | 4/1969 | Yando | |
| 4,184,188 A | 1/1980 | Briglia | |
| 4,194,668 A | 3/1980 | Akyurek | |
| 4,520,421 A | 5/1985 | Sakitani et al. | |
| 4,542,397 A | 9/1985 | Biegelsen et al. | |
| 4,724,510 A | 2/1988 | Wicker et al. | |

(Continued)

FOREIGN PATENT DOCUMENTS

WO    WO 01/34765 A1    5/2001

OTHER PUBLICATIONS

Kazuhiro Saitou, "Confrontational Switching in Self-Assembling Mechanical Systems," IEEE Transactions on Robotics and Automation vol. 15, No. 3, Jun. 1999, pp. 510-520.

(Continued)

*Primary Examiner*—S. V. Clark
(74) *Attorney, Agent, or Firm*—Blakely, Sokoloff, Taylor & Zafman LLP

(57) ABSTRACT

Methods for fabricating an assembly having functional blocks coupling to a substrate. The method includes providing the substrate with receptor sites wherein each of the receptor sites is designed to couple to one of the functional blocks. Electrodes are coupled to the substrate. The electrodes cover the receptor sites such that portions of the receptor sites are coated with the electrodes. Applying a voltage source to the electrodes using a first electrical circuit such that each electrode has a voltage different from another electrode. The electrodes form an electric field. The functional blocks having electronic devices and being in a slurry solution are dispensed over the substrate. Each functional block is fabricated out of materials having a high dielectric constant such that said functional blocks are attracted to the higher field strength regions and are guided to the receptor sites.

6 Claims, 15 Drawing Sheets

U.S. PATENT DOCUMENTS

| | | | |
|---|---|---|---|
| 4,962,441 | A | 10/1990 | Collins |
| 5,034,802 | A | 7/1991 | Liebes, Jr. et al. |
| 5,355,577 | A | 10/1994 | Cohn |
| 5,539,179 | A | 7/1996 | Nozawa et al. |
| 5,545,291 | A * | 8/1996 | Smith et al. ............... 438/107 |
| 5,783,856 | A | 7/1998 | Smith et al. |
| 5,824,186 | A | 10/1998 | Smith et al. |
| 5,858,099 | A | 1/1999 | Sun et al. |
| 5,904,545 | A | 5/1999 | Smith et al. |
| 6,222,211 | B1 * | 4/2001 | Chen .......................... 257/206 |
| 6,274,508 | B1 | 8/2001 | Jacobsen et al. |
| 6,468,638 | B2 | 10/2002 | Jacobsen et al. |
| 6,683,663 | B1 * | 1/2004 | Hadley et al. ............... 349/45 |
| 6,753,611 | B1 * | 6/2004 | Maeno et al. ............... 257/774 |
| 6,780,696 | B1 * | 8/2004 | Schatz ....................... 438/216 |
| 6,812,557 | B2 * | 11/2004 | Matsuo et al. .............. 257/686 |
| 6,864,122 | B1 * | 3/2005 | Huse et al. ................. 438/110 |
| 6,927,085 | B2 * | 8/2005 | Hadley et al. ............... 438/28 |
| 6,970,219 | B1 * | 11/2005 | Hermann .................... 349/122 |
| 2004/0068864 | A1 * | 4/2004 | Hadley et al. ............... 29/740 |
| 2005/0255620 | A1 * | 11/2005 | Hadley et al. ............... 438/28 |

OTHER PUBLICATIONS

Kazuhiro, Saitou, et al., "Externally-Resonated Linear Micro Vibromotor for Micro Assembly," Dept. of Mechanical Engineering and Applied Mechanics, University of Michigan, Ann Harbor, MI, 12 pages.

Cohn, et al., "Self-Assembly of Microsystems Using Non-Contact Electrostatic Traps," Department of Electrical Engineering and Computer Science, Berkeley, California, 1995, pp. 893-900.

Fuhr, et al., "Levitation, holding, and rotation of cells within traps made by high-frequency fields", Elsecier Science Publishers, B.V., Dec. 1992, pp. 215-223.

Cohn, M., "Assembly Techniques for Microelectromechanical Systems," Electrical Engineering and Computer Sciences, Berkeley, California, 75 pgs.

* cited by examiner

METHOD AND APPARATUS FOR SELF-ASSEMBLY OF FUNCTIONAL BLOCKS ON A SUBSTRATE FACILITATED BY ELECTRODE PAIRS

This application is a divisional of U.S. patent application Ser. No. 09/953,639, filed on Sep. 17, 2001 now U.S. Pat. No. 6,780,696. This application is also based on U.S. Provisional patent application No. 60/232,089 filed on Sep. 12, 2000 entitled "Method And Apparatus For Self-Assembly Of Components On A Substrate Mediated By Miniature Planar-Electrode Electrostatic Chucks," by Kenneth D. Schatz.

FIELD OF THE INVENTION

The invention relates to the fields of electronics, integrated circuits, opto-electronics, and assemblies of functional blocks, and specifically to the self-assembly and mounting of these small functional blocks onto a substrate to form larger, compound electronic or opto-electronic assemblies.

BACKGROUND OF THE INVENTION

There is a pressing need for new techniques of self-assembling small functional blocks onto a substrate. Two main factors drive this need. First, the economic of integrated circuit (IC) manufacturing is that of an economy of scale. The high cost of materials and processing must be divided among many, small functional blocks. Second, optimum device performance often requires that different functions of a device be performed by different materials, each possessing unique properties. Unfortunately, different materials can require different processing, and these materials and processes are not often compatible. Hence elements that make up a device must be assembled after initial processing.

As an example of how an improved self-assembly process can be beneficially applied to the first case, large area flat panel displays cannot be made cost effectively from single-crystal-silicon substrates. However, it is cost effective to construct large displays by mounting small, single-crystal-silicon transistors on low cost substrates. In this case the substrate must only provide electrical interconnection between transistors and mechanical support. As an example of the second case, optimized opto-electronic circuits may require the integration of silicon logic functional blocks with III-V semiconductor optical detectors or solid-state lasers. In this case, III-V semiconductor elements could function as functional blocks to be mounted in silicon based ICs functioning as substrate. Several methods and apparatuses for performing the mounting operation have been previously disclosed. All have specific limitations and shortcomings as discussed below.

A prior art approach is described by Yando in U.S. Pat. No. 3,439,416. Yando describes functional blocks or structures placed, trapped, or vibrated on an array of magnets. Such magnets include magnetized layers alternating with non-magnetized layers to form a laminated structure. Functional blocks are matched onto the array of magnets forming an assembly thereof. However, severe limitations exist on the shape, size, and distribution of the functional blocks. Functional block width must match the spacing of the magnetic layers and the distribution of functional blocks is constrained by the parallel geometry of lamination. In addition, self-alignment of functional blocks requires the presence of the laminated magnetic structure which puts severe limitations on the materials that can be used for both the substrate and functional blocks and can result in higher material cost. Furthermore, the structures disclosed by Yando typically possess millimeter sized dimensions and are therefore generally incompatible with micron sized integrated circuit structures. Accordingly, the method and structure disclosed by Yando is thereby too large and complicated to be effective for assembling a state-of-art microstructure of functional blocks onto a substrate.

Another approach involves mating physical features between a packaged surface mount device and substrate as described by Liebes, Jr. et al. in U.S. Pat. No. 5,034,802. The assembly process described requires a human or robotic arm to physically pick, align, and attach a centimeter sized packaged surface mount device onto a substrate. Such a process is limiting because of the need for a human or robotic arm. The human or robotic arm assembles each packaged device onto a substrate in a serial fashion, one device at a time and not simultaneously, thereby limiting the rate, efficiency, and effectiveness of the operation. Moreover, the method uses centimeter sized devices (or packaged surface mount integrated circuits), and would have little applicability with micron sized integrated circuits in die form.

Another approach, such as the one described in U.S. Pat. No. 4,542,397, Biegelsen et al., involves a method of placing parallelogram shaped structures onto a substrate by mechanical vibration. Alternately, the method may employ pulsating air through apertures in the support surface (or substrate). Limitations to the method include an apparatus capable of vibrating the structures, or an apparatus for pulsating air through the apertures. Moreover, the method described relies upon centimeter-sized die and would have little applicability with state-of-art micron sized structures.

A further approach such as that described in U.S. Pat. No. 4,194,668 by Akyurek discloses an apparatus for aligning and soldering electrode pedestals onto solderable ohmic anode contacts. The anode contacts are portions of individual semiconductor chips located on a wafer. Assembling the structures requires techniques of sprinkling pedestals onto a mask and then electromagnetic shaking such pedestals for alignment. The method becomes limiting because of the need for a shaking apparatus for the electromagnetic shaking step. In addition, the method requires a feed surface gently sloping to the mask for transferring electronic pedestals onto the mask. Moreover, the method is solely in context to electrode pedestals and silicon wafers, thereby limiting the use of such method to those structures.

Another approach, that combines many aspects of the previous two approaches, is that of Smith et al. presented in U.S. Pat. Nos. 5,904,545, 5,545,291, 5,824,186, and 5,783,856. These patents disclose a method and apparatus for the self-assembly of functional blocks into pre-formed recesses in a substrate. Recesses are formed in a substrate prior to the functional block self-assembly process. The self-assembly process includes mixing functional blocks with a liquid to form a slurry, and then flowing this slurry over a prepared substrate. Functional blocks randomly move in the slurry and can fall into the recesses. The forces holding functional blocks into the recesses are weak, and no means of modulating these forces are discussed or evident. Significantly, no technique of applying additional forces are provided.

A prior art approach is described by Cohn in U.S. Pat. No. 5,355,577. Cohn describes a method and apparatus for the assembly of micro-fabricated devices which employs electrostatic forces to trap the devices and vibration to randomly move the devices over a substrate to the trap sites. The electrostatic forces are generated by high voltage biased electrodes that substantially cover the substrate and are arranged as a parallel-plate capacitor. Devices are attracted and trapped at apertures formed in the upper electrode.

FIG. 1 illustrates a general arrangement of the method disclosed in the 5,355,577 patent. This figure illustrates a high voltage supply 50 powering a parallel-plate capacitor electrode arrangement with electrodes 66 and 70 substantially covering both sides of a substrate 68. Apertures 64 and 65 trap functional blocks 56 due to electrostatic field lines 72.

Limitations to this patent include a use of a parallel-plate electrode geometry and electrodes that substantially cover the substrate. The resulting geometry has several consequences. First, it requires at least three layers of materials to prepare a substrate for device trapping, a bottom conductor, an insulating layer, and a top conductor. Second, it is unlikely that the extensive electrodes used for trapping will be compatible with most finished products, hence additional process steps must be added to remove these electrodes after trapping. Further, once the trapping electrodes are removed, the trapping process cannot be reworked, repeated, without reforming the electrodes. And if the possibility of rework is to be allowed, then the trapping electrodes cannot also be used as electrical interconnects between devices, as the high trapping voltage recommended, ~8 kV, is not compatible with microelectronic functional blocks. An additional limitation resulting from use of parallel-plate electrodes, which substantially cover the substrate, is that there is no easy, electrical means of determining when all trapping sites are occupied. This is because, in the typical applications envisioned, the change in electrode capacitance with each trapped particle is very small relative to the total capacitance of the electrodes. Hence the change in electrical characteristics is too small to detect. A further limitation resulting from use of electrodes which substantially cover a substrate and use of the suggested high trapping voltage is that a majority of the substrate is subjected to very high electric field strength, greatly increasing the odds of failure due to dielectric breakdown. Hence the substrate material and construction must be of a universally high quality, with resulting higher costs.

It must also be noted that devices will not align over apertures as claimed if the thickness of the substrate is less than ~10 microns. Further, the high bias voltage presented is not compatible with materials of this thickness. Hence the electrode geometry claimed in the U.S. Pat. No. 5,355,577 patent cannot be construed to include the miniature and planar-electrode. The reason alignment fails is that, during mounting, devices are not ohmically connected to the top electrode, but rather are capacitively coupled. Cohn does not discuss the type of electrical connection in the U.S. Pat. No. 5,355,577 patent, but given the small size of devices envisioned, and the weak forces employed, achieving an ohmic connection is not tenable.

In the U.S. Pat. No. 5,355,577 patent, Cohn also discloses an alternate embodiment using a multitude of planar electrodes to form a negative dielectrophoresis trap. The method attracts functional blocks to regions of relatively lower electric field strength. However, a limitation exists during mounting in that functional blocks must have a lower average dielectric constant than that of the surrounding medium. Furthermore, the required electrode configuration is complex and must cover the entire substrate surface. Hence all the limitations discussed above regarding "electrodes that substantially cover the substrate" still apply here, plus limitations regarding the additional complexity of the electrode configuration.

Finally, there are many previous art disclosures that employ electrostatic chucks for various uses. Most are employed to hold a silicon wafer during IC processing, see for example, U.S. Pat. Nos. 4,184,188, 4,724,510, 4,520,421, 5,539,179, and 4,962,441, and are not amendable to mounting sub-millimeter size functional blocks. Another use proposed for electrostatic chucks is to deposit particles for chemical and pharmaceutical manufacture, U.S. Pat. No. 5,858,099. While they do employ electrostatic chucks, these disclosures do not apply to the present application.

Even with the techniques above, the concentration of functional blocks upon regions of receptor sites is not good enough. Several passes of the web through the self-assembly process is required to completely fill all of the receptor sites. In the U.S. Pat. No. 5,355,577 patent, the functional blocks only move about in a random fashion over the substrate. Thus, it is difficult to control the incident of the functional blocks upon the receptor sites.

There remains needs for rapid and efficient mounting of one or more small functional blocks on a, potentially large, substrate, while using materials, processes, and structures that are easily and economically integrated with existing flat panel display and microelectronic manufacturing processes.

SUMMARY OF THE INVENTION

Methods and apparatuses employing electric and magnetic forces and to attract, guide, align and securely clamp functional blocks at pre-determined locations on a substrate are disclosed.

In one exemplary embodiment, a substrate is provided with receptor sites wherein each of the receptor sites is designed to couple to one of the functional blocks. Electrodes are coupled to the substrate. The electrodes cover the receptor sites such that portions of the receptor sites are coated with the electrodes. A voltage source is then applied to the electrodes using a first electrical circuit such that each electrode has a voltage different from that of another electrode. The electrodes form an electric field. And, the functional blocks having electronic devices in a slurry solution are dispensed over the substrate wherein each block is fabricated out of a material having a high dielectric constant such that said functional blocks are attracted to the higher field strength regions of the electric field and are guided to the receptor sites.

In another exemplary embodiment, a substrate is provided with receptor sites wherein each of the receptor sites is designed to couple to one of the functional blocks. Multiple strips of electrodes are coupled to the substrate such that there is a slot separating the strips of electrodes from each other. A voltage source is applied to the strips of electrodes using an electrical circuit such that an electric field is generated in the slot. The functional blocks are designed such that each of the functional blocks has low dielectric constant regions that cause the functional blocks to be repelled from the higher field strength regions of the electric field and hence pushed away from the slots. The functional blocks, in a slurry solution, are then dispensed over the substrate wherein each of the functional blocks includes an electronic device and wherein the three strips of electrodes guide the functional blocks to the receptor sites.

In yet, another exemplary embodiment, a substrate is provided with receptor sites located on a first surface of the substrate wherein each of the receptor sites is designed to couple to one of the functional blocks. A first electrode plate is coupled to the first surface and the first electrode plate does not completely cover each of the receptor sites. A second electrode plate is coupled to a second surface of the substrate. The first electrode plate connects to the second electrode plate. A voltage source is applied to the first electrode plate and the second electrode plate such that an electric field is generated in each of the receptor sites in a region not covered by the first electrode plate. The functional blocks are made out of a high dielectric constant material and has a top surface, a bottom surface, and side surfaces. The functional blocks, in a slurry solution having an intermediate dielectric constant, are dispensed over the substrate. The top surface and the side surfaces of the functional blocks are coated with a low dielectric constant material such that the top surface and the side surfaces are repelled from higher field strength regions of the electric field and the bottom surface is attracted to the higher field strength regions of the electric field facilitating proper couplings of the functional blocks to the receptor sites.

In yet, another embodiment, a substrate is provided with receptor sites on a first surface of the substrate wherein each of the receptor sites is designed to couple to one of the functional blocks. The substrate is positioned relative to a pair of high magnetic permeability strips fabricated out of materials with a high magnetic permeability, such that the pair of high magnetic permeability strips not being permanently coupled to the second surface. A magnetic field is applied to a volume of space including the pair of high magnetic permeability strips such that a region of high magnetic field gradient is produced between each member of the pair of high magnetic permeability. The functional blocks are then dispensed in a slurry solution over the first surface. Each of the functional blocks, being made out of a material having a low magnetic permeability property, includes an electronic device, a top surface, a bottom surface, and side surfaces wherein the bottom surface is coupled to a high magnetic permeability layer, and, the bottom surface is attracted to the region of high magnetic field gradient facilitating proper coupling of the functional blocks to the receptor sites.

And, in another exemplary embodiment, a method to clean excess functional blocks from a substrate includes positioning a bottom surface of the substrate over an electrode layer. The electrode layer being fabricated of patterned conducting material and supporting electrically insulating material. The substrate includes the functional blocks properly deposited and bound to receptor sites located on a top surface of the substrate. Excess functional blocks are on the top surface. A voltage source is applied to the electrode layer such that an electric field is formed clamping the functional blocks that are already bounded to the receptors sites in these receptor sites. Lastly, the excess functional blocks are swept off the top surface.

BRIEF DESCRIPTION OF THE DRAWINGS

The present invention is illustrated by way of example and not limitation in the figures of the accompanying drawings, in which like references indicate similar elements and in which:

FIGS. 2-1 and 2-2 illustrate representative schematics of circuits formed by a pair of electrodes and a nearby functional block;

FIG. 3-1 illustrates an exemplary method of facilitating the self-assembly process for depositing functional blocks into receptor sites on a substrate;

FIGS. 3-2 and 3-3 illustrates an exemplary method of facilitating the self-assembly process for depositing functional blocks into receptor sites on a substrate that utilizes clamping electrodes in a top and cross-sectional views;

FIG. 5-1 illustrates an exemplary parallel guiding track that a pair of guiding electrodes may form around the receptor sites;

FIG. 5-2 illustrates an exemplary parallel guiding track having bent and curvy shapes that a pair of guiding electrodes may form around the receptor sites;

FIG. 6-1 illustrates an exemplary non-parallel guiding track that a pair of guiding electrodes may form around the receptor sites;

FIG. 6-2 illustrates an exemplary non-parallel guiding track having a guiding axis that does not follow a direction of gravity;

FIGS. 10-1 and 10-2 illustrate an exemplary embodiments which employ the concept of the use of dielectric tailoring to facilitate the depositing of the functional blocks into the receptor sites;

FIGS. 11-1 and 11-2 illustrate exemplary embodiments which employ a parallel plate field electrode to facilitate the depositing of the functional blocks into the receptor sites; and FIGS. 13-1 and 13-2 illustrate exemplary embodiments which employ a static magnetic field to facilitate the depositing of the functional blocks into the receptor sites.

DETAILED DESCRIPTION OF THE INVENTION

Theory of Operation

Figure 1:
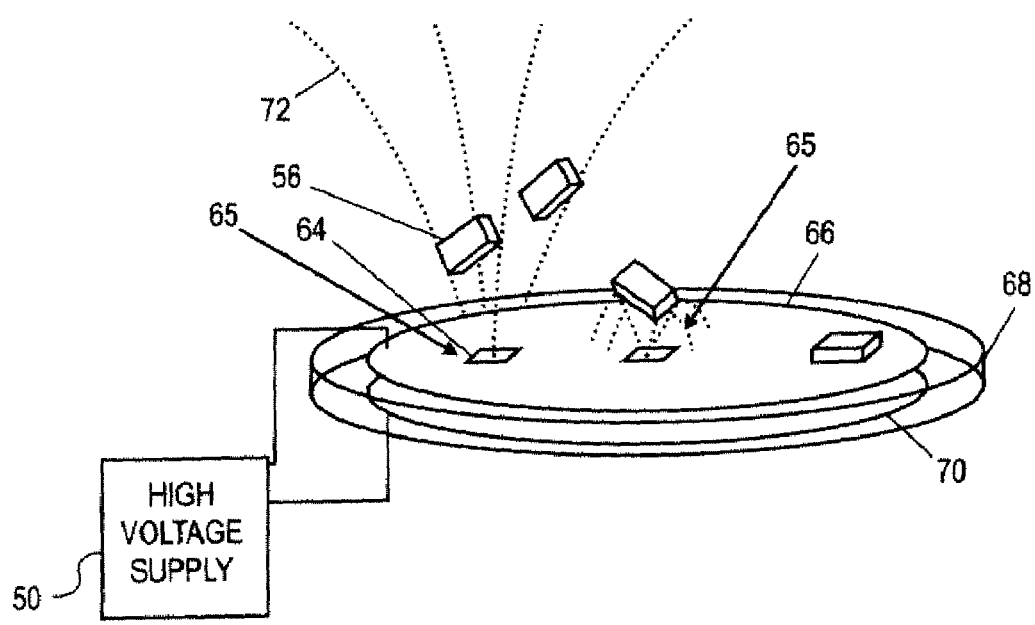
FIG. 1 illustrates a method of the prior art that employs electrodes and vibration to facilitate in the assembling of functional blocks into a substrate.

The present invention relies on electrostatic forces generated between sets (usually pairs) of substrate bound mounting-electrodes and functional blocks. The planar electrostatic chunk geometry employed in this invention produce local electrostatic forces within a functional block that are a function of the difference between the local dielectric constant in the functional block and the dielectric constant of the medium surrounding the functional blocks during the assembling or mounting procedure. These forces include dielectrophoresis and negative-dielectrophoresis. Hence the distribution of materials (i.e., of different dielectric constant) within a functional block and the geometry of the mounting-electrodes determine the forces and torques acting on a functional block at a given location. The force or torque acting on a functional block at a given location is equal to the change of energy in the electrostatic field, $$U = f(\tfrac{1}{2}) k \cdot \epsilon_O \cdot E^2 dv \qquad \text{(equation 1)},$$

for a small change in position or angular orientation of the functional block divided by that small length or angular displacement. In the equation, U is energy, k is the dielectric constant, $\epsilon_O$ is the permittivity of free space, E is the electric field strength, and the integral (f) over dv, a volume element, is calculated over all space. In general, material bodies, with zero net charge, are attracted to regions of higher field strength within an electric field. For a dielectric body in a fluid of lower dielectric constant, the body will be attracted to higher field strength regions within an electric field. If the dielectric constant of the fluid exceeds that of the body, then the greater attraction of the fluid to the higher field strength regions will effectively repel the body from these regions.

Note that the dielectric constant includes real and imaginary parts, with the imaginary part being proportional to the conductivity of the material and inversely proportional to the frequency of the electric field. Dielectric constant herein refers to the square root of the sum of the squares of the real and imaginary parts. Hence, conductors and doped semiconductors have very high dielectric constants for frequencies below the gigahertz range, and de-ionized water has a dielectric constant of approximately 80 times the free space permittivity for frequencies above the kilohertz range. In many applications of this invention an AC voltage source is used to power the electrodes, and hence the term electrostatic, as used here, refers to the electric field at frequencies such that the wavelength of the electromagnetic field, in the transport fluid, is much greater than the size of a receptor site.

For electrodes maintained at a constant voltage, the field energy can be related to the capacitance between electrodes, $$U = (1/2) C_{total} \cdot V^2 \quad \text{(equation 2),}$$

where $C_{total}$, is the total capacitance held at a constant voltage, V.

Figures 1, 2:
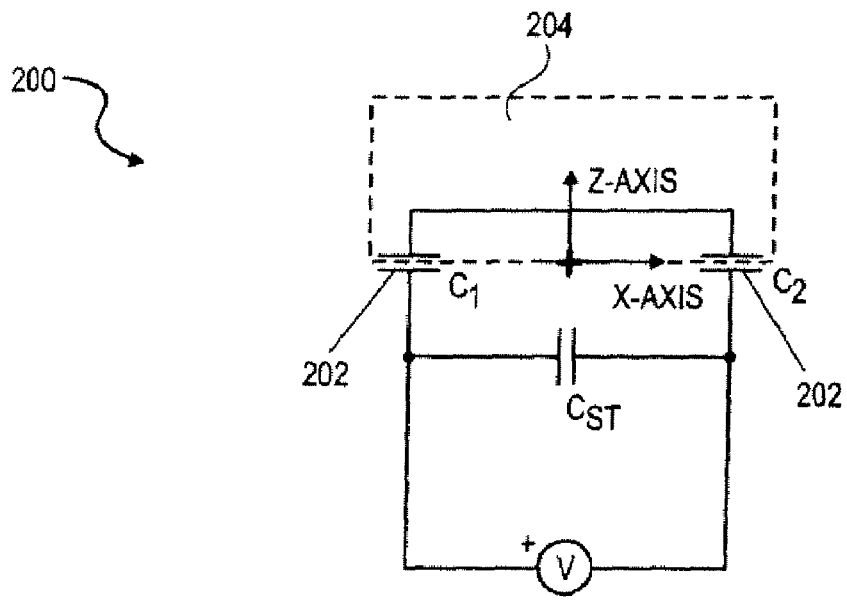
Figure 2:
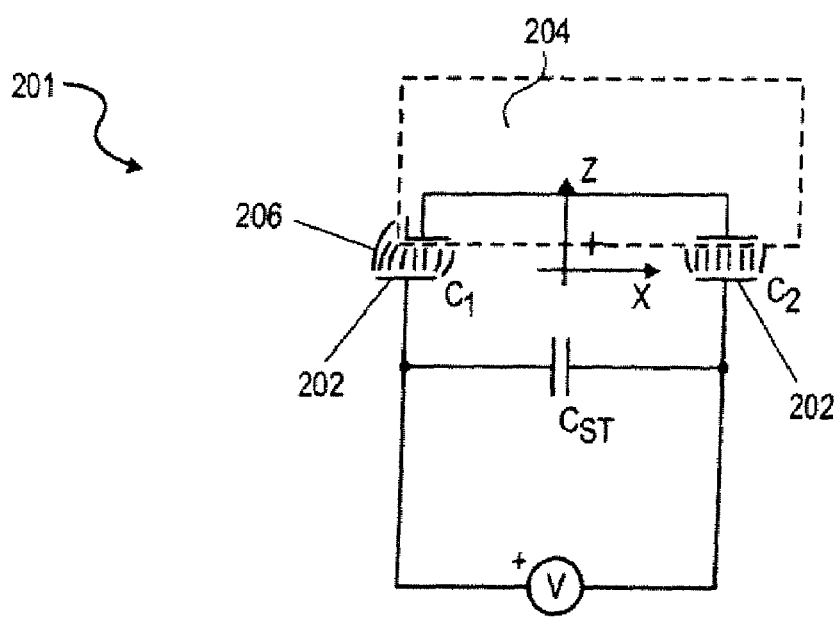

One advantage of the planar electrostatic chuck design is that the capacitance between mounting-electrodes, with no functional block present, can be made small compared to the capacitance between the mounting-electrodes and a correctly mounted functional block. This results in stronger attractive forces for a given applied voltage, and allow us to safely neglect the effect of fringe fields from a first order analysis of forces acting on a nearby functional block. FIGS. 2-1 and 2-2 are representative schematics 200 and 201 of circuits formed by a pair of mounting-electrodes 202 and a nearby functional block 204.

In FIG. 2-1, the functional block is aligned over the electrodes, whereas in FIG. 2-2 the functional block is displaced in the positive x and z directions. As shown, FIG. 2-1 illustrates a simplified schematic 200 of one set of energized mounting-electrodes 202 and a correctly mounted and aligned functional block 204. FIG. 2-2 illustrates a simplified schematic 201 of one set of energized mounting-electrodes 202 and an incorrectly mounted and a nearby functional block 204. The functional block 204 is not mounted or aligned in this figure. The unsymmetrically distorted electric field lines 206 result in a force in the x-direction. There is also a force acting in the z-direction.

$C_1$ and $C_2$ are the electrode-to-substrate capacitances and $C_{st}$ is the electrode-to-electrode stray capacitance. The applied mounting voltage is shown as V. As the functional blocks moves, $C_{st}$, as well as $C_1$ and $C_2$, will change, but generally the change in $C_{st}$ will be opposite that of $C_1$ and $C_2$ but of a lesser magnitude that is proportional to $C_{st}$. Hence for $C_{st}$ small compared to $C_1$ and $C_2$, the change in the total circuit capacitance due to changes in $C_{st}$ will be small and, to first order, can be neglected. The total circuit capacitance for FIG. 2-1 is $C_{total} = C_{st} + C_1 \cdot C_2/(C_1+C_2)$, and $C_1 = k_1 \cdot \epsilon_0 \cdot A_1/d_1$ $C_2 = k_2 \cdot \epsilon_0 \cdot A_2/d_2$ are approximations valid for parallel plate capacitors. The gradient of $C_{total}$ is equal to the gradient of $C_1 \cdot C_2/(C_1+C_2)$.

To give an example of the forces generated, take the geometry shown in FIG. 2-1, $k_1 = k_2 = k$, $d_1 = d_2 = k$, $A_1 = A_2 = A$. From the energy equation, the force acting on the functional block in the z-direction, when z is of order d, or less, and much less than order square root of A, is given by:

$$F_z = -(1/4) k \cdot \epsilon_0 \cdot A (V/z)^2 \quad \text{(equation 3).}$$

Note the minimum z is set by the thickness of any dielectric layer(s) between the mounting-electrodes and a correctly mounted functional block and is defined as d.

Additionally, k is actually the z-direction-averaged k but is here taken as a constant. For fixed geometry, the maximum z-directed force, the maximum clamping force, is determined by the minimum z=d and equals $F_z(z=d)$. The ratio (V/d) cannot exceed the dielectric strength of the dielectric layer(s), and hence the maximum mounting voltage, V, is determined by the dielectric strength and thickness, d, of the layer(s). Maximum practical values of (V/d) range from ~1E6 [V/m] ([V/m] are units of Volts per meter) to ~1E8 [V/m] depending on the materials used.

Equations for forces in the x and y-direction will depend on the change in effective area, A, for changes in functional block x and y position, respectively. For the planar electrostatic chuck geometry, forces in the x and y directions cause functional blocks to align themselves over sets of mounting electrodes so that $A_1 = A_2$ (for the case $k_1 = k_2$ and $d_1 = d_2$). Further, magnitude of the x (or y) directed forces are comparable to z directed forces when functional blocks are located at distances of x (or y)~z~width of area A in the x (or y) direction. Hence as a functional block moves toward a set of electrodes, forces acting to align the functional block can be as strong as those pulling to the substrate, and this helps to promote correct functional block alignment at mounting.

The above equations yield practical information for the design of functional blocks, and guiding and mounting electrodes. The equations imply that material regions with relatively higher, volume-averaged, dielectric constant are attracted more strongly to locations of higher electric field strength. Hence to achieve accurate alignment (including discrimination between right-side-up versus up-side-down), functional blocks should be constructed so that the clamping electrostatic forces are strongest on correctly mounted functional blocks. For example, the region of a functional block at and near its mounting surface be constructed of a high dielectric constant material or a layered structure consisting of a thin dielectric covering a high dielectric constant material. The region of a functional block at and near its mounting surface can be the region that is closest to the electrodes when correctly mounted. Other regions of a functional block should have a relatively smaller volume-averaged dielectric constant.

Further, angular alignment can be facilitated by constructing functional blocks and the electrodes with matching, non-symmetric geometry. Clamping electrodes may also be used (see below). Finally, to achieve efficient mounting, the geometry of the mounting-electrodes and the electrode-interconnects should be designed so that, in the absence of functional blocks, the electric field strength is highest between the mounting-electrodes (as opposed to between the electrode-interconnects or between a mounting-electrode and an electrode-interconnect).

A simple calculation demonstrates two key benefit of this invention. The ratio of magnitudes of the maximum electrostatic clamping force and gravitation force, $$|F_z(z=d)|/(\rho \cdot g \cdot \text{volume}),$$

can be calculated using the following reasonable parameters:

$$k=4.5,$$

$$V/d=1E7[V/m],$$

$$\rho=2500 \text{ [kg/m}^3\text{]},$$

$$g=9.8 \text{ [m/sec}^2\text{]},$$

$$\text{volume}=3 \cdot A \cdot t,$$

$$A=100 \text{ [um}^2\text{](square microns), and}$$

$$t=(\tfrac{1}{3})A^{1/2}$$

The resulting ratio $|F_z(z=d)|/(\rho \cdot g \cdot \text{volume})=4000$.

This large ratio indicates that mounted functional blocks are held securely and makes possible the tasks of aggressive rinsing and cleaning of substrates after functional block mounting. Moreover, due to the high electrostatic force, functional blocks are guided to the area near the electrodes. Situating electrode pairs near receptor sites on the substrate thus dramatically increases the concentration of the functional blocks to these receptor sites. Significantly, the relatively large electrostatic force allows rapid mixing and flow of functional blocks during the mounting process, increasing the rate at which functional blocks mount. Further, the relatively large electrostatic force allows wide process latitude and relaxed process control during functional block mounting and post-mounting rinsing, cleaning, and bonding. In addition, the mounting force is easily modulated by varying the applied mounting voltage. For example, by reducing the mounting voltage by a factor of ~1/60 below its maximum value, the ratio of electrostatic force to gravitational force is reduced to ~1.

EMBODIMENTS OF THE INVENTION

The following description discusses in length the embodiments of the present invention. The exemplary assembly process focuses on is called "fluidic self assembly" (FSA). This method is discussed in U.S. Pat. No. 5,545,291 which explains how to assemble microstructures onto a substrate. The FSA process may be performed with a web material such as the web material for a carrier substrate. In one embodiment, a flexible web material is advanced through a web process apparatus. The FSA process deposits a plurality of blocks onto the web material wherein the functional blocks are deposited onto receptor sites found in the web material. This patent is incorporated herein by reference. It will be appreciated that FSA is only an exemplary application of the embodiments discussed below and hence, is not a limitation of the invention.

During FSA process, the probability of functional blocks or microstructures correctly landing and seating in a receptor site is low. To overcome this limitation, the number of functional blocks flowed over a substrate is significantly increased and the FSA process is repeated a number of times. Clearly, this requires maintenance of large inventories of functional blocks and increases process time.

The embodiments below relates to the use of electrostatic forces to guide and confine the functional blocks in order to locally increase the density of the functional blocks incident upon the receptors sites. Further, as will be apparent, the embodiments below also use the electrostatic forces to pre-align the functional blocks for the receptor sites. These concepts are generally referred to as field-assisted self-assembly process.

Depositing the functional blocks into the substrate is part of a larger manufacturing process flow. Description of a deposition method and apparatus is presented here in a sequential format following a general process flow. A typical process flow will include the following steps; preparing the substrate for the deposition of the functional blocks, functional block manufacture, depositing the functional blocks to the substrate, bonding the functional blocks to the substrate, and forming electrical interconnects with the functional blocks.

The following section describes general aspects of the exemplary embodiments. During the field-assisted FSA process, gravitational forces as well as electrostatic forces are employed. A substrate having receptor sites designed to couple to functional blocks is tilted so that a component of gravity may act parallel to the substrate's surface. A force that is proportional to the sine of the tilt angle is used to move the functional blocks across the surface of the substrate. Electrostatic forces may then be applied to guide the functional blocks to the receptor sites. The electrostatic force form a path that the functional blocks move along until they reach a receptor sites or until they fall into a receptor sites. The electrostatic force may include a component that is parallel to the substrate's surface but perpendicular to the gravitational component. In this way the gravitational and electrostatic forces can be used to guide the functional blocks to the receptor sites. Furthermore, electrostatic forces can be used to orient or pre-align the functional blocks so as to achieve the highest possible process yield.

An electrostatic force may act to attract the functional blocks to high field regions or to repel them from the high field regions, depending on the design of the functional blocks and the FSA process. Guiding electrodes structure that may be implemented can use either an attractive or repulsive force. Furthermore, the uses of both planar and parallel plate electrodes to guide the functional blocks to the receptor sites are described.

Figures 1, 3:
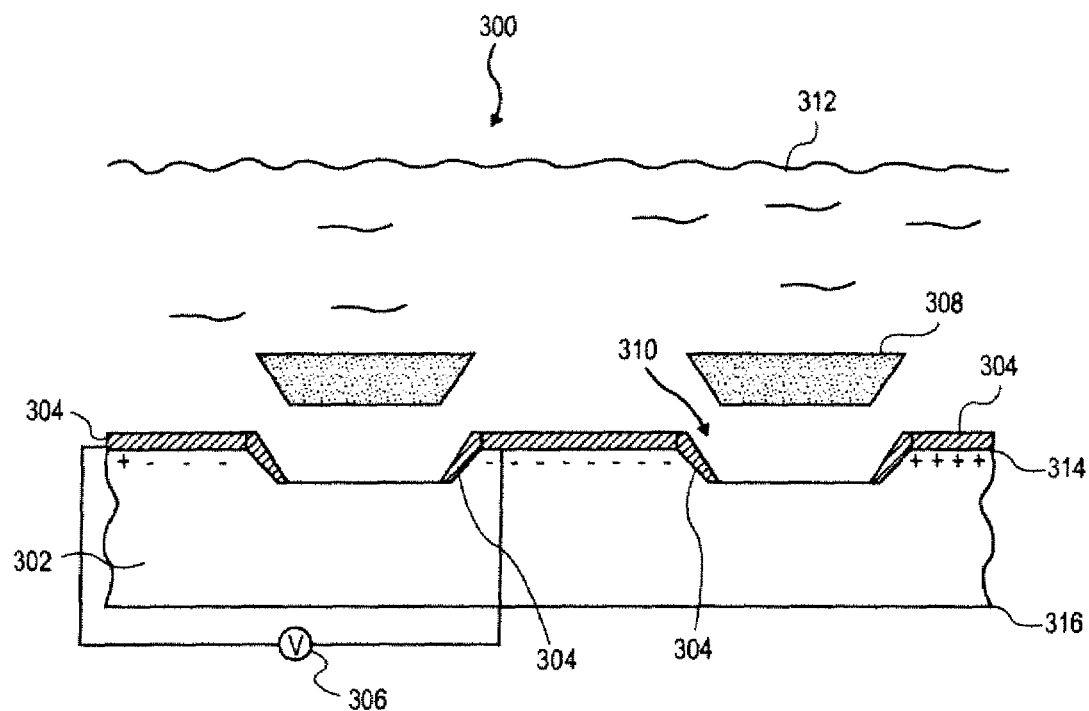

In an exemplary embodiment, electrodes and electrode-interconnects are patterned from a conducting thin film and are deposited on an insulating substrate. All mounting-electrodes and electrode-interconnects are patterned from a single metal layer. FIG. 3-1 illustrates a cross-sectional view of a method 300, which discloses how functional blocks are guided to receptor sites. This figure illustrates a small portion of an exemplary substrate 302 having guiding electrodes 304 which are coupled to a surface of the substrates 302. The guiding electrodes 304 are made out of conducting materials.

In one example, a layer of dielectric material (not shown) is deposited over the patterned conducting material (e.g., the guiding electrodes). The final surface can also be coated with an insulating dielectric layer which also insulates the guiding electrodes and electrode-interconnects. Openings (e.g., vias) are left, or formed, at locations where electrical connection between the electrodes and the mounting apparatus will be made.

Also shown in FIG. 3-1 is a representation of a voltage source 306 connected between the pair of guiding electrodes 304. A polarity is shown as indicated by the plus and minus symbols. This is not to imply a constant voltage or fixed polarity, but rather to indicate the polarity at one instant in time.

FIG. 3-1 also illustrates a method of facilitating the self-assembly process for depositing functional blocks 308 to the substrate 302. The substrate 302 is provided with receptor sites 310 wherein each of the receptor sites 310 is designed to couple to one of the functional blocks 308. The substrate of the present example includes a top surface 314 with at least one receptor site 310 and may be a silicone wafer, gallium arsenide wafer, glass substrate, ceramic substrate, or others. The substrate may also be a plastic sheet fabricated from a technique such as stamping, embossing, injection molding, among others, to create the receptor sites 310. The exemplary embodiment illustrated in this figure depicts that the receptor sites are recessed regions created into the surface of the substrate 302. However, having receptor sites being recessed is not a limitation of the present invention, see below.

In a further alternative embodiment, a conducting or semiconductor material may be used as a substrate. In this case, a layer of insulating materials is formed over the substrate, and electrodes are formed on top of this layer. Additionally, a semiconductor substrate may have integral mounting-electrodes, guiding electrodes and/or electrode-interconnects formed within the semiconductor material by differential doping. For example, using standard CMOS processing, positive biased electrodes may consist of patterned n-type regions within p-type wells, and negative biased electrodes may consist of patterned p-type regions within n-type wells. Also, substrates need not be homogeneous. Composite and matrix material structures can be used.

The present invention may be important to applications such as Liquid Crystal Flat Panel Displays (LC FPD). Other devices may include liquid crystal displays, polymer dispersed liquid crystal displays, electroluminescent (EL) material displays, organic light emitting diode (OLEDs) displays, up and downconverting phosphor (U/DCP) displays, electrophoretic (EP) material displays, or light emitting diode (LEDs) diplays.

In one example, the receptor sites 310 are recessed receptor sites designed to mate with the functional blocks 308. When the functional blocks 308 are coupled to the receptor sites 310, the functional blocks 308 are deposited within the receptor sites 310 as well as being recessed below the surface 314 of the substrate 302.

Also shown in this figure, the functional blocks 308 have a trapezoidal profile. The trapezoidal profile functional blocks 308 can be created using conventional methods that use a second substrate having a top surface, and growing a sacrificial layer overlying the top surface. A step of forming a block layer overlying the top surface is then performed. Masking and etching the block layer up to the sacrificial layer creates trapezoidal shaped blocks thereon. The receptor sites 310 in this example are designed to couple with these blocks and thus, also have the trapezoidal profile. The receptor sites 310 may also have similar dimensions to these blocks 308. These similarities in shape and size help the receptor sites to easily accept the functional blocks 308 thereby facilitating perfect mating of these blocks 308 to these receptor sites.

It will be appreciated that the functional blocks and the receptor sites may have other shapes, for instance, a cylindrical shape, pyramid shape, rectangular shape, square shape, T-shape, kidney shape, or the like.

As mentioned, a pair of guiding electrodes 304 is coupled to the substrate 302. This coupling can be accomplished by any conventional method for depositing metals upon a surface. The guiding electrodes 304 can be formed most anywhere on the substrate 302. In one exemplary embodiment, the pair of guiding electrodes is patterned upon a surface 314 of the substrate 302. In one example, the pair of guiding electrodes 304 covers the receptor sites in that the pair of guiding electrodes 304 is patterned on the surface 314 such that it forms a track surrounding the receptor sites. In another example, the pair of guiding electrodes 304 is also patterned into portions of the receptor sites 310. As illustrated, the pair of guiding electrodes 304 is centered around each of the receptor sites 310 and not within the receptor sites 310. However, the receptor sites 310 need not be completely included within the track of the guiding electrodes. Even when the receptor sites 310 are not completely within the track of ti e guiding electrodes, the functional blocks 308 can still be transported along the track and flown over the receptor sites 310.

The guiding electrodes can be formed using any appropriate deposition and pattern forming methods including deposition of a conducting film by vacuum evaporation, sputtering, ionized sputtering, plating, electroplating, electrodeless plating, or screen printing, and patterning by standard lithography and wet or dry etching. Alternately, patterning may proceed conductor deposition, as in resist lift-off or dual damascene techniques.

The guiding electrodes may be formed in structures formed from several, stacked conductor layers separated by insulating layers. In other words, the conduction path between electrodes, and the electrodes themselves, need not be formed from a single layer of conducting material. This allows individual electrode-interconnects to cross over each other without shorting; one electrode-interconnect passes over the other with an insulating layer separating them. Additionally, it allows for the easiest integration of this invention when mounting functional blocks on top of complex electronic devices (e.g., integrated circuits) that employ multiple levels of circuit interconnects. Further, the guiding electrodes are primarily conduction pathways and may be constructed of any conducting material or material combination or structure, and may be formed and patterned by any means.

Alternative embodiments of the guiding electrodes include guiding electrodes formed of conducting material with no covering dielectric, and those covered by an insulating material layer. An insulating layer may be a deposited material or an anodic conversion layer. This insulating layer may be patterned to facilitate making electrical contact to the underlying conductor, to increase clamping force by reducing the dimension d (defined in the theory section), or to form alignment structures. Further, the geometry of the electrode conductor and, if present, the insulating layer can be constructed to form the substrate bound portion of an alignment structure.

A voltage source 306 is applied to the pair of guiding electrodes 304 using an electrical circuit such that each of the guiding electrodes 304 has an opposite polarity to the other. The application of the voltage source 306 to the guiding electrodes 304 creates an electric field to receptor sites 310. In a preferred embodiment, this electric field is an electric field within and near receptor sites 310. The electric field can also be the region located between the pair of guiding electrodes 304. It is further preferred that this electric field is a strong electric field.

The functional blocks 308, being carried in a slurry solution 312, are then flown over the substrate 302. In general, these functional blocks 307 include semiconductors that are manufactured on silicon wafers. Alternatively, the functional blocks 308 can be a functional microstructure or a micro-scale electronic devices such as integrated circuit (not shown). These functional blocks have been invented and disclosed in a copending U.S. patent application Ser. No. 09/251,220 which was filed Feb. 16, 1999 by the inventor John Stephen Smith and which is entitled "Functionally Symmetric Integrated Circuit Die." This application is hereby incorporated herein by reference.

In one example, the functional blocks 308 are also fabricated out of a material or materials having a high dielectric constant and as such, are attracted to the higher or stronger electric field strength regions created by the guiding electrodes. Being attracted to the higher field strength electric field, the functional blocks are thus guided toward the electrode portions in the receptor sites, hence, they are being guided into the receptor sites. The movement of the functional blocks is not random. The blocks move along the path created by the pair of guiding electrodes.

The functional blocks must also be formed prior to their mounting. The functional blocks are designed and constructed to perform several functions. They must gainfully perform some function for a completed assembly, whether as a circuit element (e.g., IC chip, discrete transistor, diode, passive interconnect, photovoltaic cell, piezo-electric transducer, opto-electronic circuit, solid-state laser, or superconducting circuit or functional block such as a SQUID), structural element (e.g., spacer or standoff), optical element (e.g., optical filter, shutter, mirror, or lens), or micro-electromechanical (MEM) device or element. The functional blocks must also be designed and constructed to facilitate accurate and efficient mounting.

Functional blocks may contain active elements that are capacitively coupled to the mounting-electrodes, and hence can participate in a circuit formed by the mounting apparatus electronic equipment, electrode-interconnects, mounting-electrodes, and functional blocks. Such a circuit can provide utility during the mounting process by allowing functional blocks to be poled for presence, alignment, and operability. These capacitive interconnects can also be used in the finished assembly.

In one example, the functional blocks 308 are dispensed and transported over the substrate 302 by gravity. Any conventional method of depositing microstructure onto a substrate can be used, for example, FSA. One way to achieve this is to tilt the web line of the substrate 302 during the FSA process so that there is a component of gravity that is in the plane of the surface 314 of the substrate 302. In another example, a fluid flow is created to facilitate the dispensing of the functional blocks 308. One way to create the fluid flow is by using a suitable pump to create a continuous flow of the slurry solution to push it across the web during the FSA process. In yet another example, a pressure field can be applied to the slurry solution 312 to facility the dispensing of the functional blocks. Here, pressure can be created by using an ultrasonic sound device or by applying a vibration to the web to exert forces upon slurry solution during the FSA process.

Embodiments of the mounting apparatus include any arrangement which facilitates the distribution of functional blocks over a substrate, and where the functional blocks are made to travel above the surface 314 of the substrate 302 passing near sets of mounting-electrodes at random times and with random orientations. Functional blocks may be distributed over a substrate by pouring, sprinkling, shaking, vibrating, or flowing. A transport fluid (the slurry solution 312) may also be employed to facilitate functional block distribution. The transport fluid may be a gas or mixture of gases, such as air, nitrogen, $O_2$, $CO_2$, CO, $SF_6$, or a gas saturated with water vapor, or a liquid may be used, such as de-ionized water, formamide, ethyl alcohol, methyl alcohol, organic solvents, chlorofluorocarbons, mineral oils, liquid $CO_2$, or mixtures of these liquids, or a liquid with additives, such as de-ionized water with a surfactant or detergent agent. In such an arrangement, functional blocks are entrained in a fluid flow and carried by the transport fluid over a substrate. The fluid flow may be driven by an external force, for example, by gravity, mechanical pumping, thermal-convection currents, or bubbling a gas through a liquid transport fluid. Random motion of functional blocks over a substrate can be driven by mechanical stirring of the transport fluid, flow of the transport fluid, bubbling a gas through a liquid transport fluid, or mechanical or sonic agitation or vibration of the substrate, transport fluid, or mounting apparatus.

Figure 4:
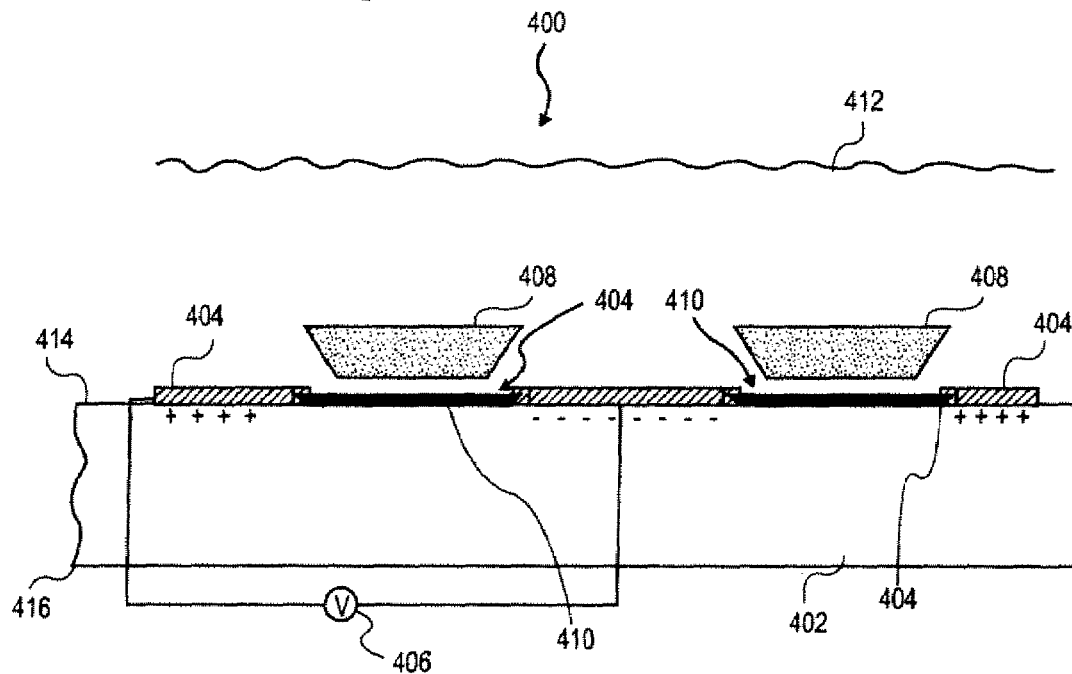
FIG. 4 illustrate an exemplary method of facilitating the self-assembly process for depositing functional blocks into receptor sites on a substrate wherein the receptor sites are non-recessed receptor sites.
Figures 2, 3:
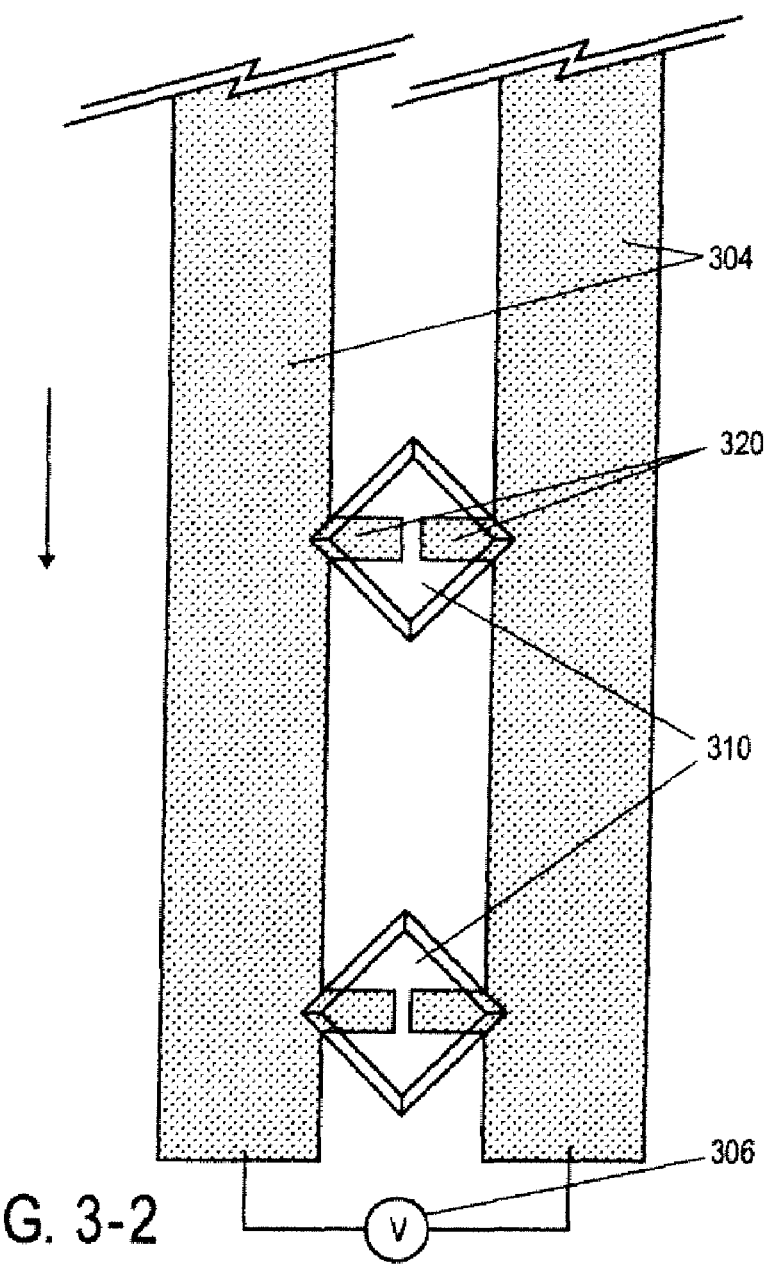
Figure 3:
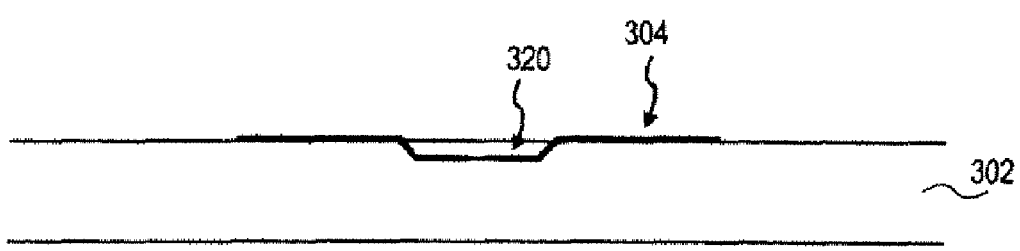

FIG. 4 illustrates an example of a non-recessed receptor site. As depicted, receptor sites 410 are not recessed below a surface 414 of the substrate 402. There are several methods that may be used to make block receptor sites. The choice of method depends in part on the material to be used. If the substrate is an organic material and is an amorphous or semicrystalline polymer, the receptor sites may be embossed into the polymer material with a mold that matches the block size and pitch for the device being produced (e.g., an active matrix LCD). The receptor sites can be molded or carved into a surface, or, be designed as a raise area of a substrate. The receptor sites can be bosses, protrusions, bulges, or protuberances. It will be appreciated that embossing is just one method of forming the receptor sites in a polymeric coating on the glass. The coating may alternatively be injection molded onto the glass substrate during the coating process. Alternatively, the receptor sites could be formed in the polymer by solvent casting a polymer solution onto a receptor site mold. The solvent cast sheet could then be laminated or transferred to the glass substrate. Thus, the receptor sites 410 can be a mold formed on top of the substrate, and as such, need not be a recessed region in the substrate 402.

Also shown in FIGS. 3-1 and 4, the voltage source 306/406 is connected between the pair of guiding electrodes. A polarity is shown is these figures, however, this is not to imply a constant voltage or fixed polarity, but rather to indicate the polarity at one instant in time. The + and − signs shown in these figures, and other figures below, are intended to indicate how charges in a set of guiding electrodes and correctly mounted functional block are distributed due to application of a mounting voltage, V. These regions of net charge generate the electrostatic forces that attract the functional block to the guiding electrodes.

In one example, the pair of guiding electrodes 304 can even be extended further into the receptor sites 310 creating a pair of clamping electrodes 320. The clamping electrodes 320 can be extensions of the guiding electrodes 304. Alternatively, the clamping electrodes can be deposited using another electrode material. In that event, the voltage source to create the opposite polarities in the clamping electrodes 320 can be from an entirely different electrical circuit from the voltage source that is used to create the opposite polarities for the guiding electrodes 304. (See FIG. 3-2 and 3-3).

The use of clamping electrodes has the following advantages. The relatively large electrostatic force allows rapid mixing and flow of functional blocks during the mounting process, increasing the rate at which functional blocks mount. Further, the relatively large electrostatic force allows wide process latitude and relaxed process control during functional block mounting and post-mounting rinsing, cleaning, and bonding. Additionally, the electrostatic clamping force is easily modulated and can be maintained during any post-mounting operations or reduced to zero if functional blocks need to be detached.

Figures 1, 5:
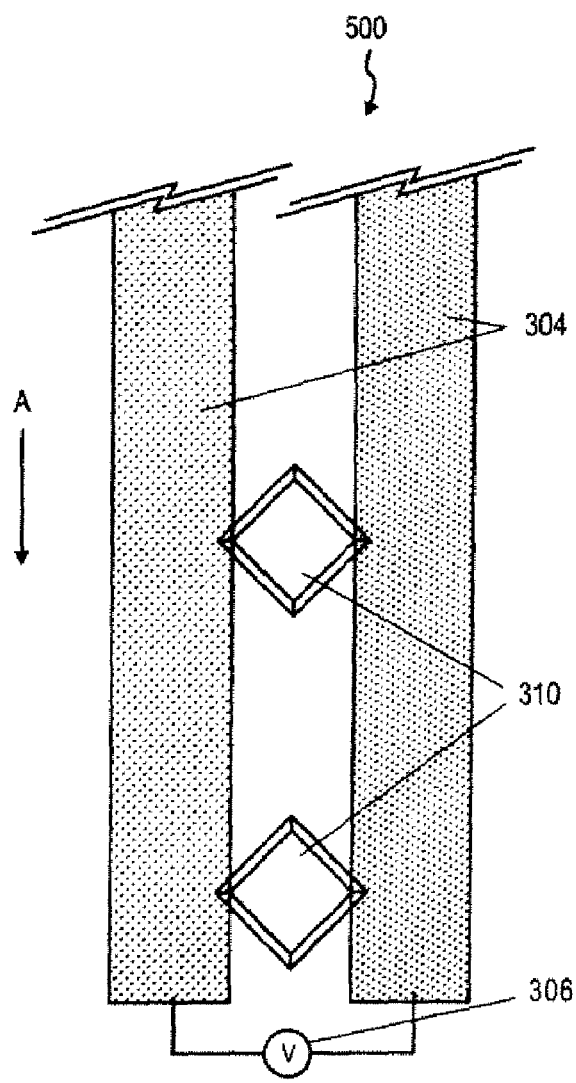
Figures 2, 5:
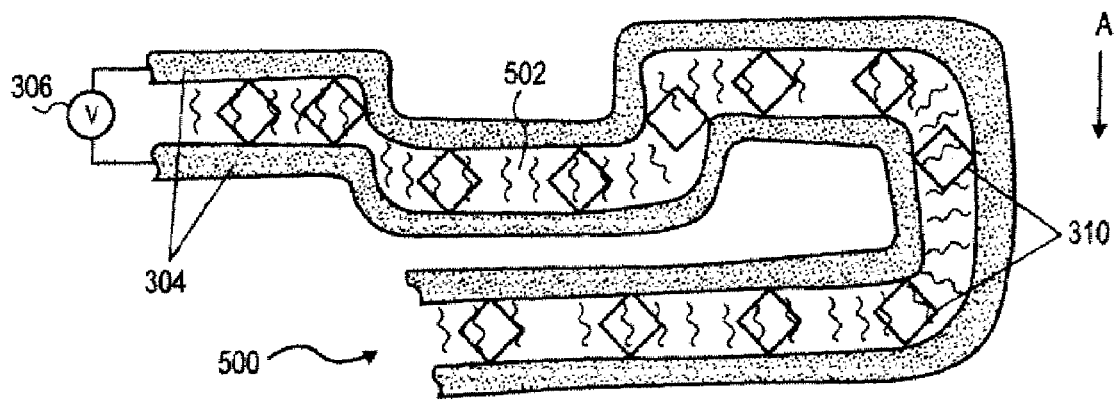

In one example, as shown in FIG. 5-1, the pair of guiding electrodes 304 forms a parallel guiding track 500 around the receptor sites 310. And, as shown in FIG. 5-2, the parallel guiding track 500 can also be bent, curved and formed into any shape around the receptor sites to cover as many receptor sites 310 as possible.

These figures also show that the pair of guiding electrodes terminates when there is no more of the receptor sites 310 to cover. However, the pair of guiding electrodes can terminate at a predetermined distance from any of the receptor sites 310. One reason for that is that the guiding electrodes in these embodiments are used to guide the functional blocks 308 to the receptor sites. In effect, these methods increase the concentration of the functional blocks 308 flowing over the receptor sites. The functional blocks 308 move along and within the pair of guiding electrodes much like blocks moving along a trough in an organized fashion. The pair of guiding electrodes at the receptor sites 310 is not, however, necessary to clamp down the functional blocks 308 into or onto the receptor sites 310.

FIG. 5-1 shows that when the guiding tracks 500 are parallel, the guiding track 500 should not be perpendicular to the component of gravity that is in the plane of the surface of the substrate (as depicted by arrow A). As the functional blocks flow over the substrate, the gravitational force helps move the functional blocks move along the guiding track toward the receptor sites. When the guiding track 500 is perpendicular to the component of gravity, (as shown in FIG. 5-1), without any external force, the functional blocks will be attracted to and fall into the guiding track, and stay there as opposed to moving along the track toward the receptor sites. Note that the guiding track need not be aligned along the component of gravity that is in the plane of the surface of the substrate, but it must be at some small angle to this direction. The angle can be a predetermined angle, for example, a 15-degree, a 30-degree, or a 45-degree angle to the gravity direction. In this way, the functional blocks move down the substrate under the influence of gravity and are transported to and along the guiding electrodes.

Figures 1, 6:
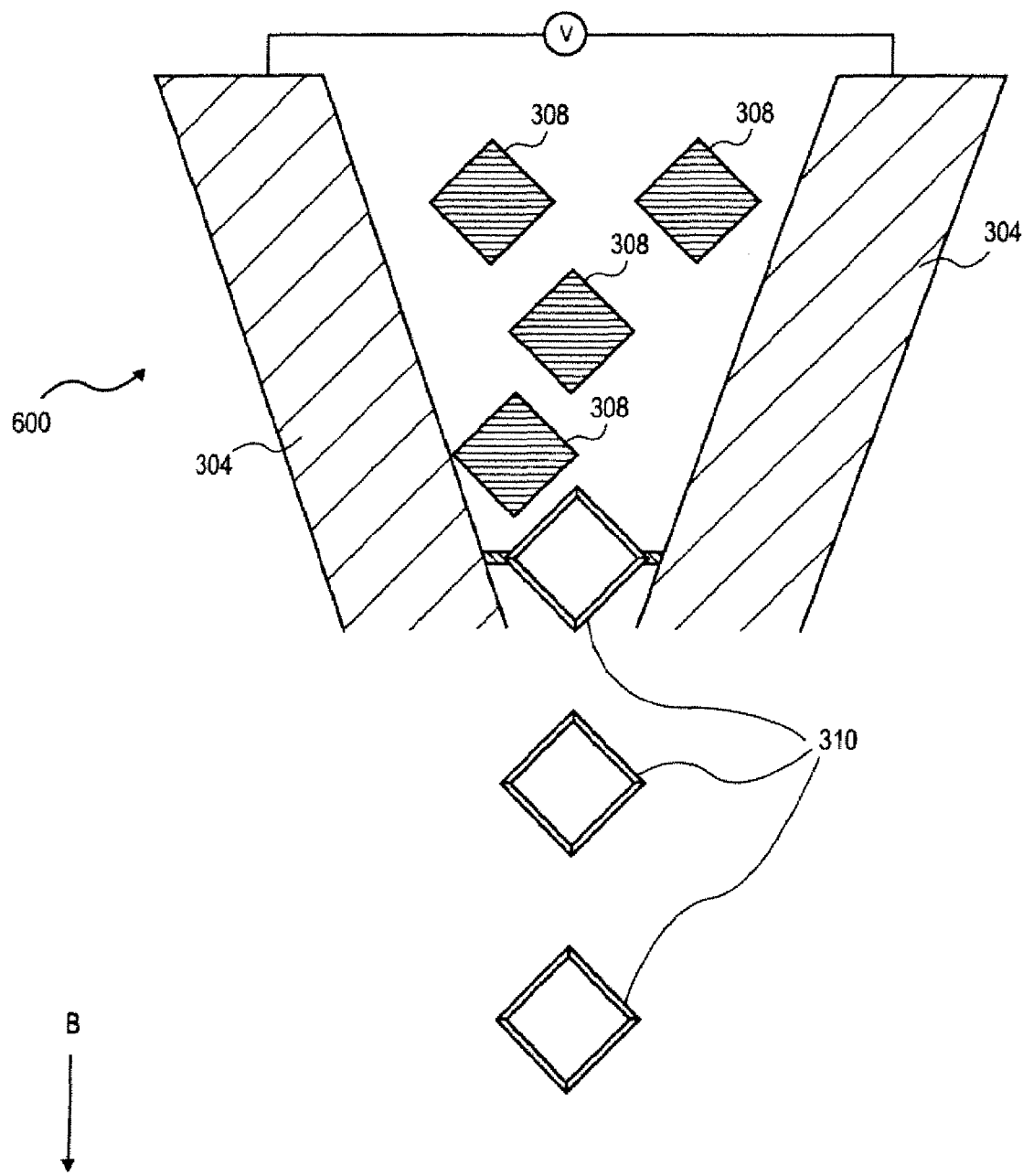
Figures 2, 6:
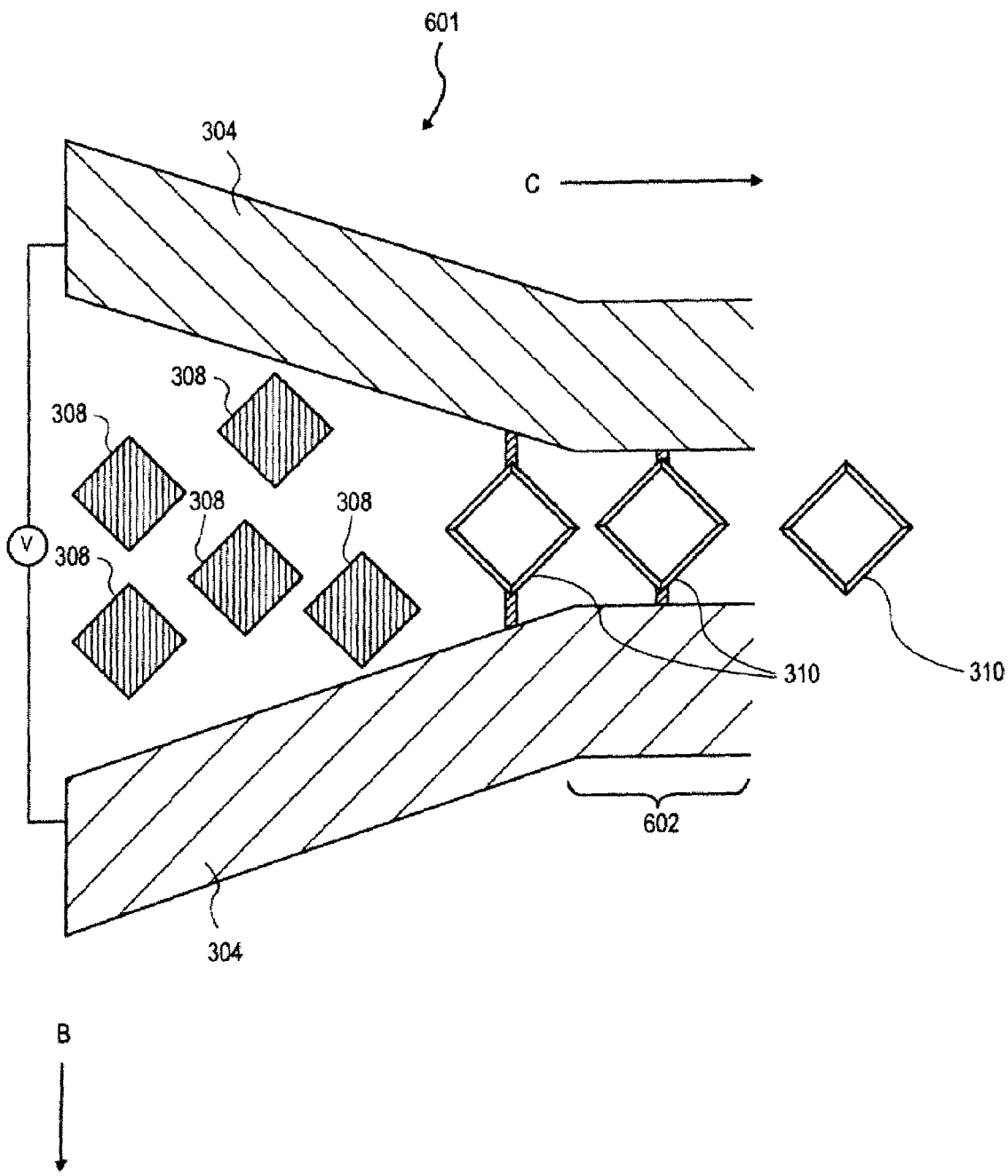

In another example, as shown in FIG. 6-1, the pair of guiding electrodes 304 forms a non-parallel guiding track 600 around and just before the receptor sites 310. When the guiding electrodes are not parallel, an electrostatic force is created in the direction in which the distance between the electrodes is changing. Here, as the distance between the guiding electrodes 304 narrows, the electrostatic force increases. The strong electrostatic force at the narrow end of the pair of guiding electrodes 304 is strong and thus, tends to pull the functional blocks 308 toward the narrow end increasing the concentration of the incident of the functional blocks 308 upon the receptor sites 310.

One feature of the non-parallel guiding track 600 is that the guiding track 600 needs not follow a direction of a functional block of gravity as desired for guiding track 500. Unlike the guiding track 500, the guiding track 600 needs not follow the direction of gravity as depicted by the arrow B (see FIG. 6-2). The strong electrostatic force at the narrow end of the pair of guiding electrodes 304 pulls the functional blocks 308 toward the narrow end toward the receptor sites 310.

In a preferred embodiment, an external force as discussed above is applied to facilitate the flow of the functional blocks 308 over the substrate. Examples of the external force can be (1) tilting the substrate in the direction of gravity to utilize the gravity force for the flow, (2) using a conventional pump to create a constant fluid flow in the direction of the desired flow, (3) utilizing an ultrasonic sound device to apply pressure to the flow and (4) vibrating the substrate in the direction of the desired flow.

The problem observed in the guiding track 500 wherein the guiding track 500 does not follow the same direction with the gravity component is alleviated with the use of external force. Thus, as depicted in FIG. 5-2, an external force 502 (e.g., vibration or continuous flow) facilitates the movement of the functional blocks 310 along the pair of guiding electrodes 304 which has the guiding track 500 that does not follow the direction of gravity as illustrated by the arrow A.

In another embodiment, the pair of guiding electrodes 304 forms a funnel shape guiding track 601 having a pre-alignment section 602. The guiding track 601 is similar to the guiding track 600 discussed above except for the pre-alignment section 602. The pre-alignment section 602 has a shape and orientation that are substantially similar to the receptor sites 310 and the functional blocks 308. These similarities properly pre-align the functional blocks 308 into the orientation necessary for coupling with the receptor sites 310.

Figure 7:
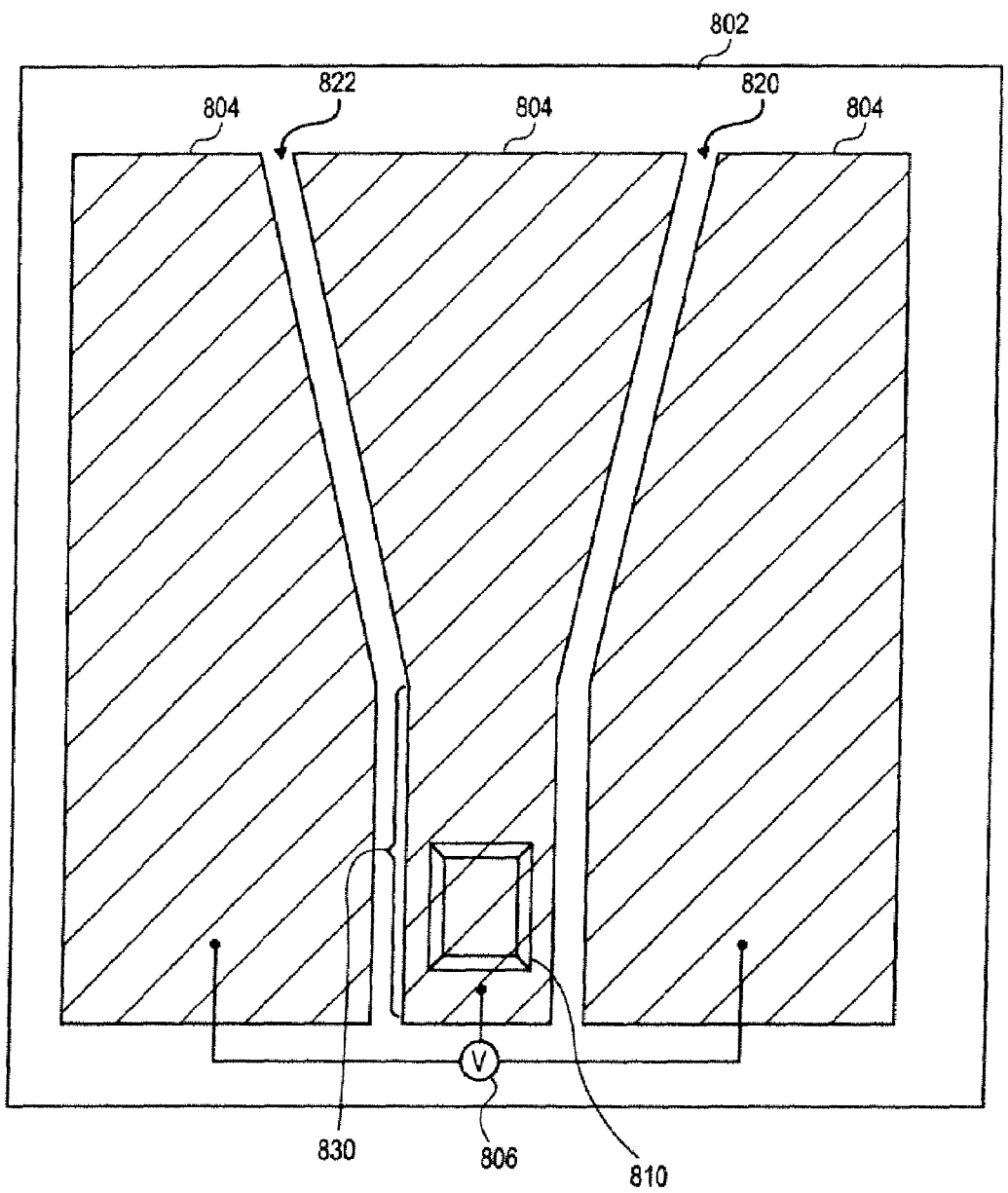
FIG. 7 illustrates another exemplary embodiment which facilitates the depositing of the functional blocks into the receptor sites.

FIG. 7 illustrates yet another exemplary embodiment of the present invention. In all aspects except for the patterning of the guiding electrodes, this embodiment is similar to the embodiments discussed above. FIG. 7 shows that three strips of electrodes 804 are coupled to the substrate's surface. The substrate 802 of FIG. 7 is like the substrate 302 discussed above. The guiding electrodes 804 are similar to the guiding electrodes 304 discussed above except that when a voltage source 806 is applied to the guiding electrodes 304, the voltage differences between the electrodes produce an electric field between each two electrodes 804. In this event, slots 820 and 822 are regions of higher electric field strength created by the voltage differences between each two strips of electrodes 804. When the two electrodes 804 are positioned closer to each other, the slot 820 or 822, which is the distance between the two electrodes 804, becomes smaller. Such small distance indicates that the electrostatic field in the slot 820 or 822 is very high. Controlling the distance will help controlling the strength of the electric field.

In this embodiment, the functional blocks (not shown) are encapsulated in a low dielectric material so that they are repelled from the regions of higher field strength, the slots 820 and 822. As the functional blocks move along the substrate, due to the action of gravity or other force, the functional blocks thus migrate more toward the electrodes 804 and as such, are guided toward receptor sites 810.

In another embodiment, the guiding electrodes 804 forms a funnel shape guiding track which is similar to the guiding track 601, and has a pre-alignment section 830, which is similar to the pre-alignment section 602 above. The pre-alignment section 830 has a shape and orientation that are substantially similar to the receptor sites 810 and the functional blocks (not shown). This pre-alignment section 602 thus properly pre-aligns the functional blocks 308 into the orientation necessary for coupling to the receptor sites 310.

Figure 8:
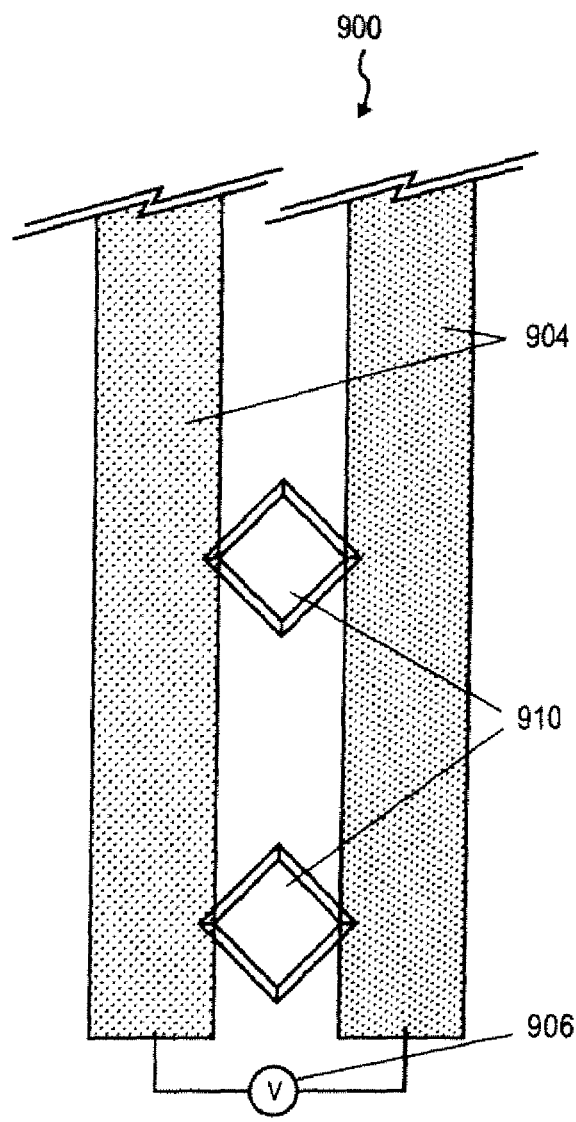
FIGS. 8 and 9 illustrate another exemplary embodiment which facilitates the depositing of the functional blocks into the receptor sites.
Figure 9:
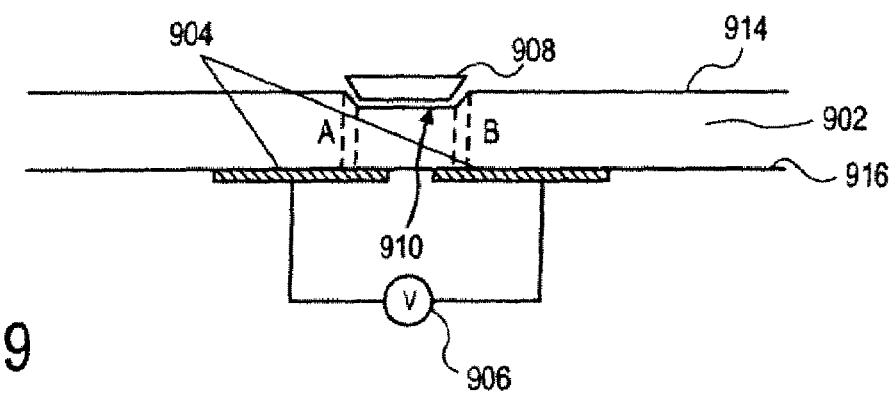

FIGS. 8 and 9 illustrate yet another embodiment in which the pair of guiding electrodes as discussed above (see FIGS. 3-4) are located on the bottom surface of the substrate (e.g., surfaces 316, 416, and 916). FIG. 8 illustrates the top view and FIG. 9 illustrates the cross-sectional view of the embodiment. Similar to how the guiding electrodes are deposited upon the top surface 314 discussed above, the guiding electrodes 904 can be deposited and patterned on the bottom surface 916 utilizing the same methods. Typically, the substrate 902 is thin enough so that the electric field generated by the guiding electrodes penetrates the substrate to affect the top surface, over which the functional blocks 908 are dispensed. All of the benefits observed in the embodiments discussed above are also observed in this particular arrangement of the guiding electrodes.

Alternatively, the pair of guiding electrodes can be located on a separate fixture. The substrate 902 is then positioned relative to the pair of guiding electrodes during the FSA process. The guiding electrodes can be removed at the completion of the coupling of the functional blocks 908 into the receptor sites. Furthermore, the guiding electrodes can be reused for more than one batch thus, saving the cost of fabricating the assembly.

In one example, the substrate 902 is positioned relative or over the pair of guiding electrodes 904 such that the bottom surface 916 is in immediate contact with the pair of guiding electrodes. Furthermore, in the event that the functional blocks 908 are not peripherally treated so that there are regions having the low dielectric constant as discussed above, the pair of guiding electrodes is positioned such that portions of each of the receptor sites 910 can be affected by an action of the pair of guiding electrodes. For instance, as shown in FIG. 9, portions A and B will be affected by the pair of guiding electrodes. When the voltage source 906 is applied to the pair of guiding electrodes, the electric field, preferably, a high electric field, discussed above will be generated. This electric field will penetrate the substrate 902 and affect the portions A and B in the receptor site 910. Thus, the functional blocks having a high dielectric constant will be attracted toward these portions, thereby, being guided into the receptor site 910.

In the event that the functional block 908 is treated so that portions or all of the functional block has a low dielectric constant, the pair of guiding electrodes may terminate at some distance before the receptor site 910. This will prevent the guiding electrodes from interfering with the receptor site 910.

The section below discuss the dielectric tailoring of the functional blocks to facilitate the FSA process. The addition of electric fields to the FSA process offers the ability to increase the incidence of functional blocks upon the receptor sites, hence, improving both yield and speed of the FSA process. However, without dielectric tailoring, incorrect alignment and orientation of the functional blocks can hinder the efficiency of the FSA process.

The electric force on an uncharged, homogeneous and a functional block suspended in a fluid and subjected to an electric field gradient is a function of the difference between the dielectric constant of the functional blocks and that of the fluid. When the dielectric constant of the functional block exceeds that of the surrounding fluid, the functional block is attracted to regions of higher field strength. Alternatively, if the dielectric constant of the fluid exceeds that of the functional block, the functional block is repelled from regions of higher field strength.

Figures 1, 10:
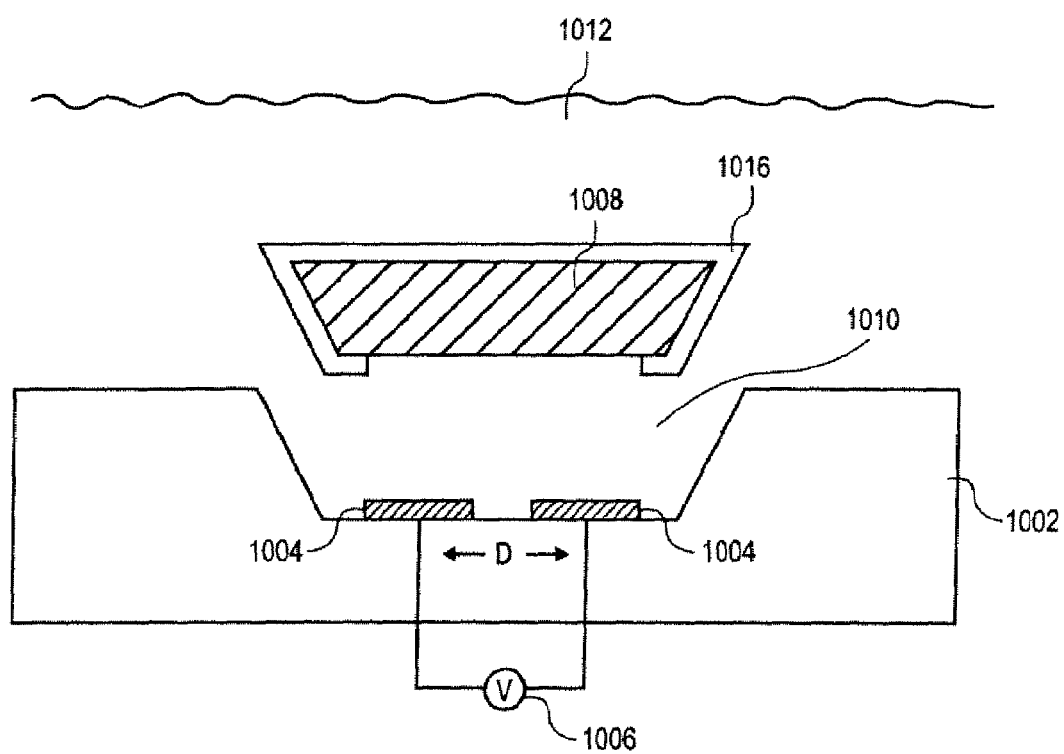
Figures 2, 10:
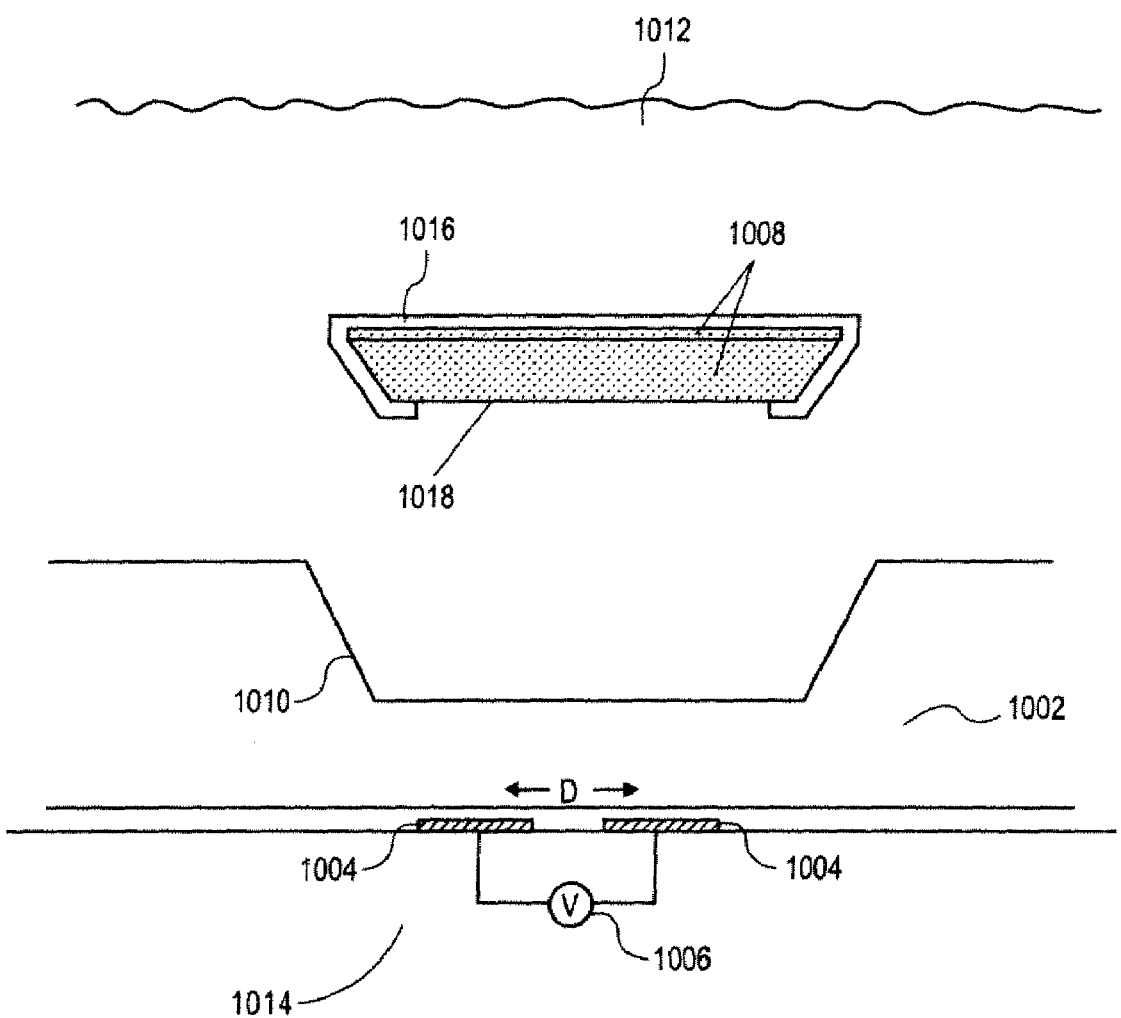

FIG. 10-1 illustrates another exemplary embodiment of the present invention which is referred to as dielectric tailoring. All aspects of this embodiment are similar to the embodiment discussed in FIGS. 3-4 except that the functional blocks 1008 is treated such that portions of the functional blocks 1008 has low dielectric constant surfaces. Here, the top surface and the side surfaces of the functional block 1008 have coated with a layer of material 1016 having a low dielectric constant. The coating may have a predetermined thickness. The bottom surface of the functional block 1008 thus remains a surface having a high dielectric constant. This is the case since typically, the functional blocks are made out of a high dielectric material as mentioned above.

The FSA process is conducted using fluid of intermediate dielectric constant for the slurry solution 1012. Examples of such fluids include water, formamide, methol, ethanol, acetone, isopropanol, ethylene glycol, and other high dielectric constant fluids, or mixtures of these. The slurry solution 1012 may also include additives such as surfactant and bonding agents.

Another feature of the present invention is that the electrodes 1004 are coupled to the receptor sites as shown in FIG. 10-1. These electrodes 1004 are also referred to as clamping electrodes since they will act to attract and hold the functional blocks 1008 into the receptor sites 1010. These electrodes 1004 can be deposited into the receptor sites using any conventional method of depositing and patterning conductor discussed above as for the case with guiding electrodes. Once a voltage source 1006 is applied to the electrodes 1004, they generate an electric field that attracts materials having a dielectric constant higher than that of the slurry solution 1012.

In one example, the energized electrodes 1004 generates a maximum electric field gradient at the lowest surface of each receptor site. The functional blocks can be electrostatically clamped at the receptor sites 1010 only if they are correctly oriented and will be repelled from the receptor site otherwise.

During the FSA process, the functional blocks will orient themselves so that the bottom surface of each block will be attracting to the electric field created by the electrodes 1004. A slurry solution 1012 having a dielectric constant that is intermediate to the high dielectric constant regions of the functional blocks 1008 and the low dielectric constant material 1016 can be used in this embodiment to facilitate the dispensing of the functional blocks. The functional blocks will be properly aligned prior coupling to the receptor sites and thus, the efficiency of the FSA process is greatly improved.

In one example, the functional blocks are designed so that the low dielectric constant layer is continuous. For example, the blocks may include functional blocks that cause the whole surface of the block to have the low dielectric constant. A high dielectric constant region can simply be fabricated by patterning a thin conducting film deposited over certain portion of the low dielectric constant layer, e.g., the bottom surface of the functional block.

In another example, to prevent incorrect electrostatic clamping, the thickness of the low dielectric surface coating should be at least in the order $(k_{low}/k_{FSA})*D$ where $k_{low}$ is the dielectric constant of the surface coating, $k_{FSA}$ is the dielectric constant of the slurry solution 1012, and D is the distance between the center points of the pair of electrodes 1004 within the receptor site 1010.

The low dielectric constant regions 1016 on the functional blocks 1008 can be created by coating the periphery of the functional blocks with a lower dielectric constant material. Examples of materials that can be used for coating the periphery of the functional blocks includes $Si_xO_y$, $Si_xO_yN_z$, $Si_xN_y$ other interlayer dielectric, or passive materials commonly employed in semiconductor manufacturing, or organic coatings such as photoresist, parylene, epoxy, Teflon, wax, oil, rubber, and other low dielectric constant polymer or organosilicons films. It will be appreciated that multi-layer films can also be employed.

Alternatively, a layer of material having a low dielectric constant such as an organic polymer, wax, photoresist, glass, or silicon dioxide may be coated on one or more of their non-mounting surfaces (e.g., the top surface of the functional blocks). Further, structures may be formed on non-mounting surfaces that inhibit these surfaces from closely approaching mounting electrodes. Such structures ensure that the maximum electrostatic force acting on an incorrectly oriented functional block is below that needed to maintain the functional block at the electrodes.

FIG. 10-2 illustrates a minor variation from the embodiment discussed in FIG. 10-1. The electrodes 1004 of this example are located on a fixture 1014, over which the substrate 1002 is positioned during the FSA process until the completion of the fabrication of the assembly. In this case, the electric field generated by the electrodes penetrates the dielectric material of the substrate and affects the functional blocks 1008.

In summary, to allow electrostatic clamping, the functional block must have a regions or regions of high dielectric constant material that is accessible to the electric field. The portions of high dielectric constant material may be covered with a very thin layer of a low dielectric constant material and still will be accessible to the electric field.

Figures 1, 11:
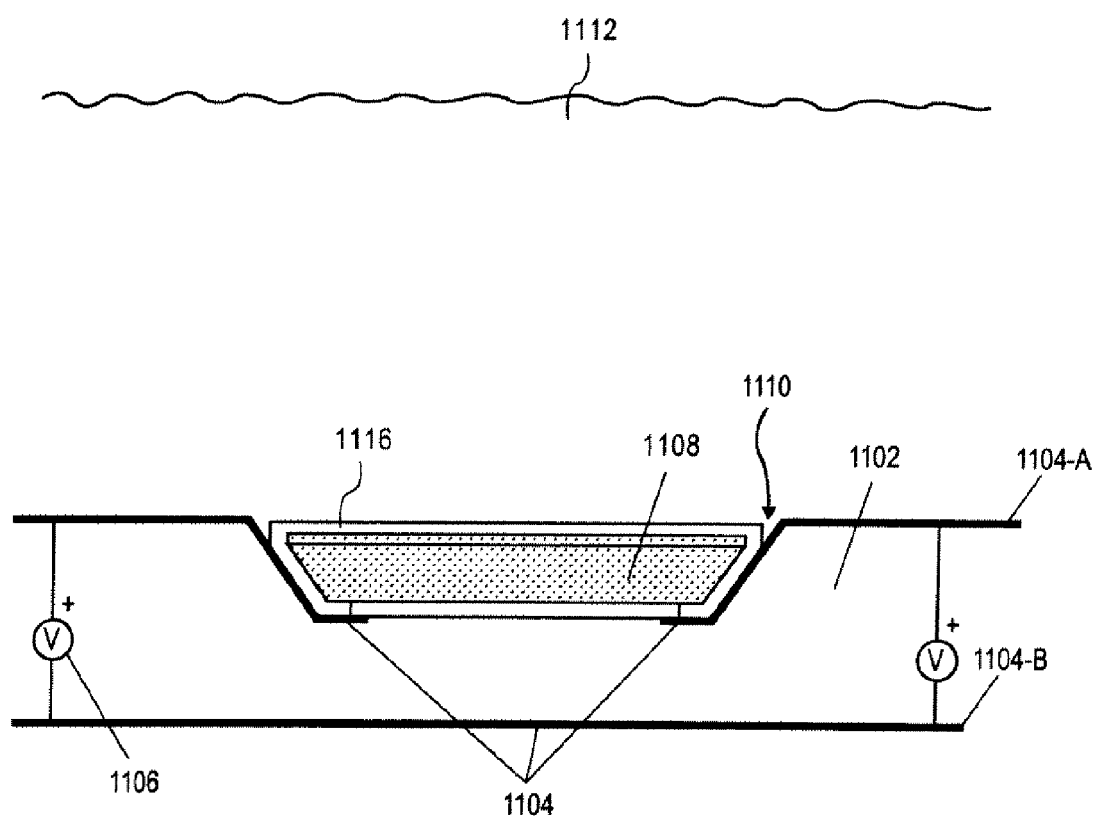
Figures 2, 11:
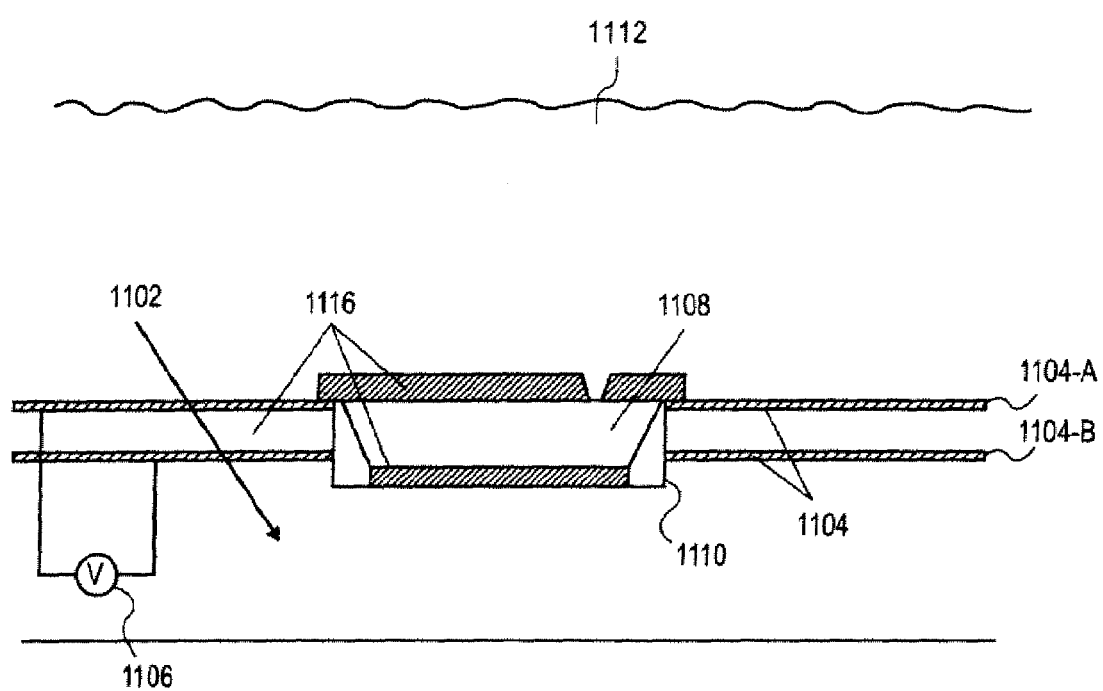

FIG. 11-1 illustrates another embodiment in which parallel plate field generating electrodes are employed. This embodiment is similar to the embodiments discussed in FIGS. 10-1 and 10-2. One main difference is that in this embodiment, the electrode pair 1104 utilizes a first electrode plate 1104-a and a second electrode plate 1104-b, each locating on one surface of the substrate 1102. Both of the first electrode plate 1104-a and the second electrode plate 1104-b can be made out of a conductive material and are connected to a voltage source. A polarity is created between these two plates when they are energized.

In one example, the receptor site 1110 is a recessed receptor site that is formed into the substrate 1102. The receptor site 1110 thus penetrates the first electrode plate 1104-a. In another example, the first electrode plate 1104-a does not completely cover the receptor site 1110 leaving an area not coupling to the electrode plate. When the voltage source 1106 is applied to these electrode plates, an electric field is created in the area in the receptor site 1110 that is not coupled to the electrode plate.

The functional block 1108 having the top surface and the side surfaces coated with a low dielectric material, being carried in the slurry solution 1112, can then be dispensed over the substrate 1102 using the methods described above. The bottom surface of the functional block 1108, not treated to have a low dielectric constant is accessible to the electric field and is thus attracted to the receptor site 1110. Also, the slurry solution has an intermediate dielectric constant to assist in the dispensing of the functional block 1108 into the receptor site 1110.

In another example, the receptor site 1110 is also a recessed receptor site that is formed into the substrate 1102, but the receptor site may penetrate through both of the first electrode plate 1104-a and the second electrode plate 1104-b as depicted in FIG. 11-2. When the voltage source 1106 is applied to these electrode plates, an electric field is created in the entire receptor site 1110. The functional block 1108 having the top surface and the bottom surface coated with a low dielectric material, being carried in the slurry solution 1112, can then be dispensed over the substrate 1102 using the methods described above. The side surfaces of the functional block 1108, not treated to have a low dielectric constant is accessible to the electric field and is thus attracted to the receptor site 1110. Similar to above, the slurry solution has an intermediate dielectric constant to assist in the dispensing of the functional block 1108 into the receptor site 1110.

It will be appreciated that the receptor site 1110 shown in FIG. 11-2 has a rectangular shape that does not match the trapezoidal shaped functional block 1108. The shape of the receptor site 1110 is only for illustration purpose and can simply have the shape that match the functional block 1108 as mentioned above.

Figures 1, 13:
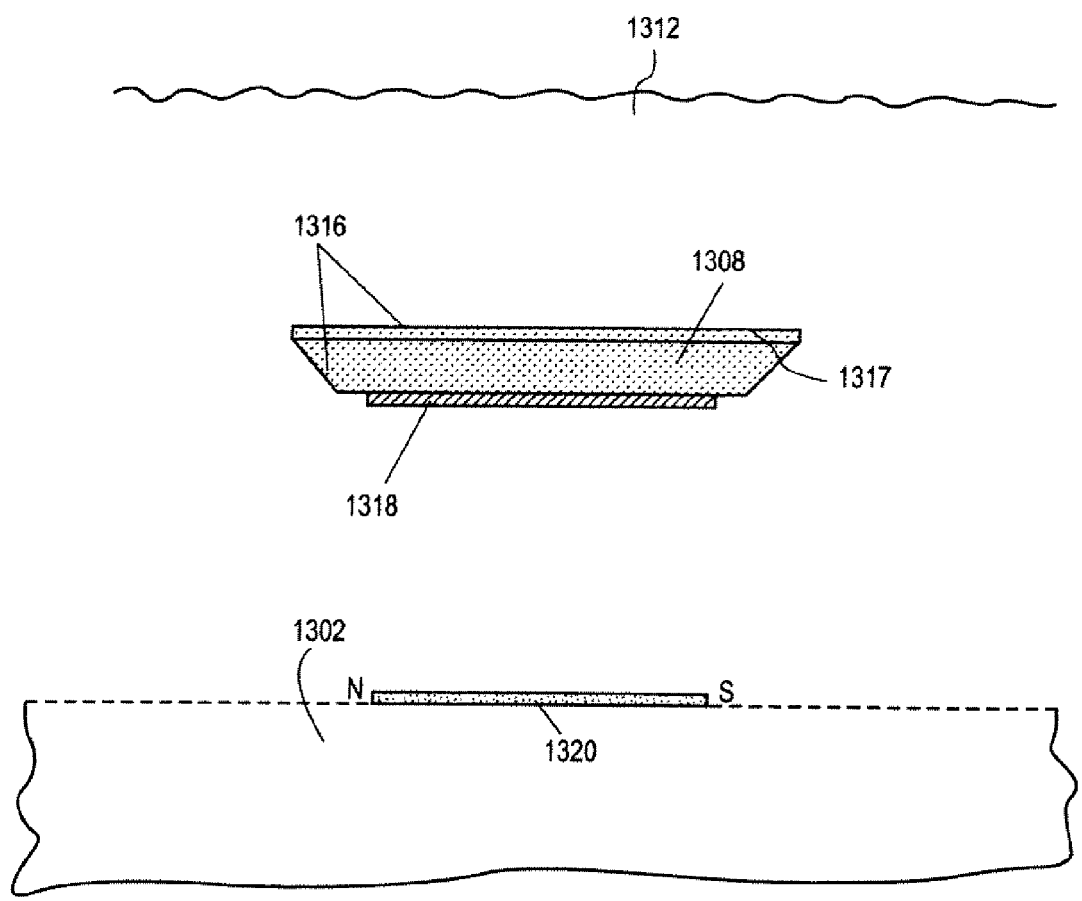
Figures 2, 13:
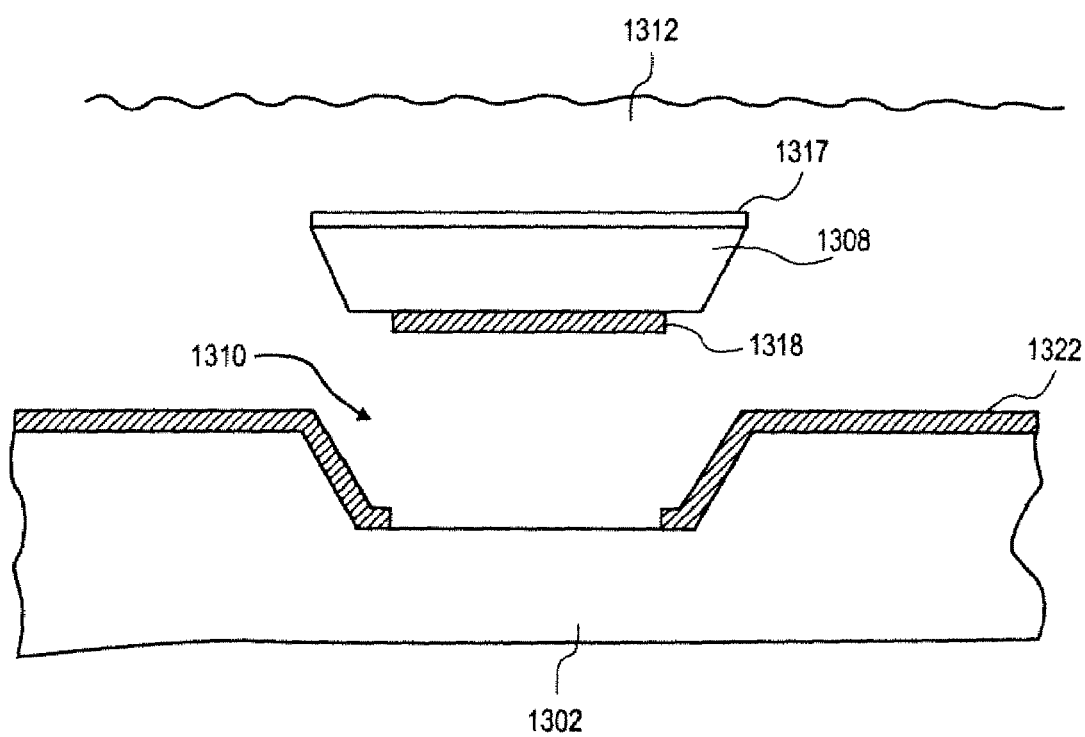

FIGS. 13-1 and 13-2 illustrate yet another exemplary embodiment of the present invention. This embodiment also utilizes a concept similar to that of the dielectric tailoring the functional blocks discussed above. However, this technique applies a field-assisted FSA process using static magnetic fields to attract, align and clamp the functional blocks into the receptor sites. This technique is referred to as permeability tailoring.

In this exemplary embodiment, high magnetic permeability materials, such as ferromagnetic materials, take the place of the electrode conductor and high dielectric constant material coating discussed in FIGS. 10-1, 10-2, 11-1, and 11-2. The low magnetic permeability materials are substituted for the low dielectric constant materials. The FSA slurry solution 1312 (e.g., ferrofluids) used in this embodiment has an intermediate value of magnetic permeability.

FIG. 13-1 illustrates that in one instance, the functional block 1308 is made out of a low magnetic permeability material giving the functional block 1308 the low magnetic permeability surface layer 1316. A high magnetic permeability layer 1318 is coupled to the bottom surface of the functional block 1308. A receptor site of shown in this figure may be a non-recessed receptor site that is covered with a permanent magnet 1320 having a North (N) and South (S) poles. However, the receptor site of the present example may also be a recessed receptor site and the permanent magnet 1320 can be deposited to the bottom of the receptor site and within the substrate 1302 (not shown). Moreover, the magnet 1320 can also be coupled to the backside of the substrate (not shown) or on a fixture over which the substrate is positioned during the FSA process.

FIG. 13-2 illustrate that in another instance, high magnetic permeability material 1322 with gap in circuit at the receptor site 1310 is deposited upon the substrate 1302. The functional block 1308 is subjected to the same coating as discussed in FIG. 13-1. Thus, the functional block 1308 has the low magnetic permeability surface layer 1317 and the high magnetic permeability layer 1318. A magnetic field, aligned parallel to the substrate 1302 is then applied. The functional block 1308 is deposited to the receptor site 1310 similar to discussed in FIG. 13-1. In another example, the magnetic field can be an external source of magnetic field (e.g., a permanent magnet or an energized electrode magnet used together with a power supply).

In one example, for proper alignment of the functional block, a low magnetic permeability material 1316 is coated on the top surface of the functional block 1308. This thickness of this low magnetic permeability material is determined by a distance "D" of the high magnetic permeability layer coupled to the bottom of the functional block 1308. In this arrangement, the functional block 1308 will not couple to the matching receptor site unless the orientation is right side up.

Dielectric tailoring provides a number of significant advantages to field assisted FSA. First, it can be used to prevent electrostatic clamping of multiple functional blocks at and around a receptor site where only one functional block per site is desired. Second, it can be employed to prevent electrostatic clamping of upside down or grossly tilted functional blocks at the receptor sites. Third, it can be employed to improve the alignment accuracy, position and angle of the functional blocks as electrostatically clamped at the receptor sites.

The embodiments discussed above can be applied to a post-FSA process in which excess functional blocks are removed or swept off the substrate. The excess functional blocks are blocks that are not coupled or are not properly coupled to receptor sites.

The substrate and the functional blocks of this example need not be subjected to the same treatments discussed above. Assembling of the functional blocks to the substrate of this example can just be done using the well known FSA process. No guiding or clamping electrodes, electrode plates or magnetic permeability layer are incorporated into the system. This example relates to how the methods discussed above can be employed to assist in cleaning the excess functional blocks after the FSA process. This embodiment is thus applicable to the substrate that already had the functional blocks properly deposited and bound to receptor sites located on its top surface.

To clean the excess functional blocks off the top surface of the substrate, in one example, the bottom surface of the substrate is positioned over an electrode layer such as fixture 1014 shown in FIG. 10-2. A voltage source is applied to this electrode layer such that an electric field is formed thereby clamping the functional blocks to the receptor sites. With the electric field helping to hold the functional blocks in the receptor sites, the excess functional blocks can be swept from the top surface in any vigorous manner. Examples of methods to sweep off the excess functional blocks include cleaning the top surface using a vacuum cleaner, rubbing along the top surface using scraper, tilting the substrate, inverting the substrate, flowing a fluid over the top surface to rinse off said excess functional blocks, or any other convenient technique to clean the surface.

The use of the energized electrode layer helps anchor the functional blocks in the receptor sites. Conventional methods of cleaning the surface of the substrate after the FSA process often cause the functional blocks to be knocked off of detached form the receptor sites due to the weak force holding the functional blocks to the receptor sites. This embodiment thus allows for vigorous and safe cleaning of the assembly of the substrate having the functional blocks deposited therein.

As with all of the embodiments discussed above, after rinsing and cleaning, the functional blocks are bonded to the substrate. This can be performed while electric field or the magnetic field continue to be applied to the substrate. The bonding operation may occur in a different process tank or apparatus than was used for mounting of the functional components to the substrate. A dielectric bonding layer is applied over the substrate, encapsulating and holding the functional blocks. After bonding, the mounting voltage is removed, and the substrate is removed from the mounting apparatus. Finally, vias are patterned through the bonding layer. These vias expose substrate and functional block contact pads that are electrically connected in a subsequent blanket metal deposition and patterning process.

The functional block bonding methods include deposition of an encapsulating film by any of the standard processes including vacuum evaporation, chemical vapor deposition (CVD), plasma-enhanced CVD, sputtering, ion plating, plating, spray coating, dip coating, roll coating, or spin coating. Alternate bonding materials include adhesives, blanket encapsulating conducting or dielectric films, patterned conducting or dielectric films, polymer films, silicon dioxide, silicon nitride, silicon oxynitride, polyimide, epoxy, or photoresist materials. Alternately, bonding can be achieved by anodic bonding, using the mounting-electrode as anode. Alternately, a thin film structure similar to that employed in Flash memory cells can be formed as part of the functional block facing surface of the mounting-electrodes or at the mounting surface of the functional blocks. This structure will hold charge after the mounting voltage is removed; thus electrostatic forces are maintained.

The invention claimed is:

1. An electronic assembly including:
    a plurality of functional blocks coupled to a substrate, said substrate including a plurality of receptor sites wherein each of said plurality of receptor sites is designed to couple to one of said plurality of functional blocks;
    electrodes associated with each of said plurality of receptor sites to create an electrostatic field generated at the time that one of the plurality of functional blocks is coupled to a corresponding one of the plurality of receptor sites, said electrodes to guide said plurality of functional blocks into said plurality of receptor sites.

2. An electronic assembly as in claim 1 wherein said plurality of functional blocks are made out of a high dielectric material.

3. An electronic assembly including:
    a plurality of functional blocks coupled to a substrate, said substrate including a plurality of receptor sites wherein each of said plurality of receptor sites is designed to couple to one of said plurality of functional blocks;
    electrodes associated with each of said plurality of receptor sites to create an electrostatic field, said electrodes to guide said plurality of functional blocks into said plurality of receptor sites; wherein each of said plurality of functional blocks has a top surface, a bottom surface and side surface, said top surface and said side surfaces are coated with a low dielectric constant material such that said top surface and said side surfaces are repelled from an electric field and said bottom surface is attracted to said electric field.

4. An electronic assembly as in claim 1 wherein said plurality of functional blocks are coupled to said substrate through a fluid self-assembly process.

5. An electronic assembly as in claim 4 wherein a slurry solution having an intermediate dielectric constant is used for said fluid self-assembly process.

6. An apparatus including:
    a functional block coupled to a substrate, said substrate including a plurality of receptor sites located on a first surface of said substrate wherein each of said plurality of receptor sites is designed to couple to said functional block, said functional block, being made out of a high dielectric constant material, has a top surface, a bottom surface, and side surfaces wherein said top surface and said side surfaces are coated with a low dielectric constant material such that said top surface and said side surfaces are repelled from an electric field generated at the time that the functional block is coupled to a corresponding one of the plurality of receptor sites and said bottom surface is attracted to said electric field.

* * * * *